United States Patent
Shirotori et al.

(10) Patent No.: US 9,966,122 B2
(45) Date of Patent: May 8, 2018

(54) MAGNETIC MEMORY DEVICE

(71) Applicant: Kabushiki Kaisha Toshiba, Minato-ku (JP)

(72) Inventors: Satoshi Shirotori, Yokohama (JP); Hiroaki Yoda, Kawasaki (JP); Yuichi Ohsawa, Yokohama (JP); Hideyuki Sugiyama, Kawasaki (JP); Mariko Shimizu, Nerima (JP); Altansargai Buyandalai, Kawasaki (JP); Naoharu Shimomura, Meguro (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days. days.

(21) Appl. No.: 15/449,040

(22) Filed: Mar. 3, 2017

(65) Prior Publication Data
US 2018/0040357 A1    Feb. 8, 2018

(30) Foreign Application Priority Data
Aug. 4, 2016    (JP) .................. 2016-154040

(51) Int. Cl.
*G11C 11/00* (2006.01)
*G11C 11/16* (2006.01)
(Continued)

(52) U.S. Cl.
CPC ........ *G11C 11/161* (2013.01); *G11C 11/1675* (2013.01); *H01L 27/222* (2013.01); *H01L 43/08* (2013.01); *H01L 43/10* (2013.01)

(58) Field of Classification Search
CPC . G11C 11/161; G11C 11/1675; H01L 27/222; H01L 43/08; H01L 43/10
(Continued)

(56) References Cited

U.S. PATENT DOCUMENTS 7,164,181 B2 *  1/2007  Osipov ................... G11C 11/16
                                                          257/422
2004/0188733 A1  9/2004  Asao et al.
(Continued)

FOREIGN PATENT DOCUMENTS

JP    2004-296869 A    10/2004
JP    2005-19457 A      1/2005
(Continued)

OTHER PUBLICATIONS

Tohru Takeuchi, et al., "Stress in Thin Tantalum Films Deposited by Magnetron Sputtering", The Vacuum Society of Japan, vol. 30, 1987, 6 pgs. (with partial English translation).

*Primary Examiner* — Huan Hoang
(74) *Attorney, Agent, or Firm* — Oblon, McClelland, Maier & Neustadt, L.L.P.

(57) ABSTRACT

According to one embodiment, a magnetic memory device includes a metal-containing layer including a metallic element, a first magnetic layer, a second magnetic layer, and a first intermediate layer. The second magnetic layer is provided between the first magnetic layer and a portion of the metal-containing layer. The first intermediate layer includes a portion provided between the first magnetic layer and the second magnetic layer. The first intermediate layer is non-magnetic. The first intermediate layer is convex toward the metal-containing layer.

16 Claims, 13 Drawing Sheets

(51) Int. Cl.
*H01L 43/08* (2006.01)
*H01L 43/10* (2006.01)
*H01L 27/22* (2006.01)

(58) Field of Classification Search
USPC .......................................................... 365/158
See application file for complete search history.

(56) References Cited

U.S. PATENT DOCUMENTS

| | | |
|---|---|---|
| 2004/0257865 A1 | 12/2004 | Honjo et al. |
| 2005/0219895 A1 | 10/2005 | Guo et al. |
| 2006/0014306 A1 | 1/2006 | Min et al. |
| 2006/0028862 A1 | 2/2006 | Min et al. |
| 2006/0118842 A1 | 6/2006 | Iwata |
| 2009/0224300 A1 | 9/2009 | Yamagishi et al. |
| 2012/0217594 A1 | 8/2012 | Kajiyama |
| 2014/0056060 A1 | 2/2014 | Khvalkovskiy et al. |
| 2015/0082900 A1 | 3/2015 | Fuji et al. |
| 2015/0200003 A1 | 7/2015 | Buhrman et al. |
| 2015/0236071 A1 | 8/2015 | Lee et al. |

FOREIGN PATENT DOCUMENTS

| | | |
|---|---|---|
| JP | 2005-303298 | 10/2005 |
| JP | 2006-32973 | 2/2006 |
| JP | 2006-165327 A | 6/2006 |
| JP | 2009-212323 | 9/2009 |
| JP | 2012-182219 A | 9/2012 |
| JP | 2014-45196 | 3/2014 |
| JP | 2014-49659 A | 3/2014 |
| JP | 2015-59932 | 3/2015 |
| JP | 2015-534272 A | 11/2015 |

\* cited by examiner

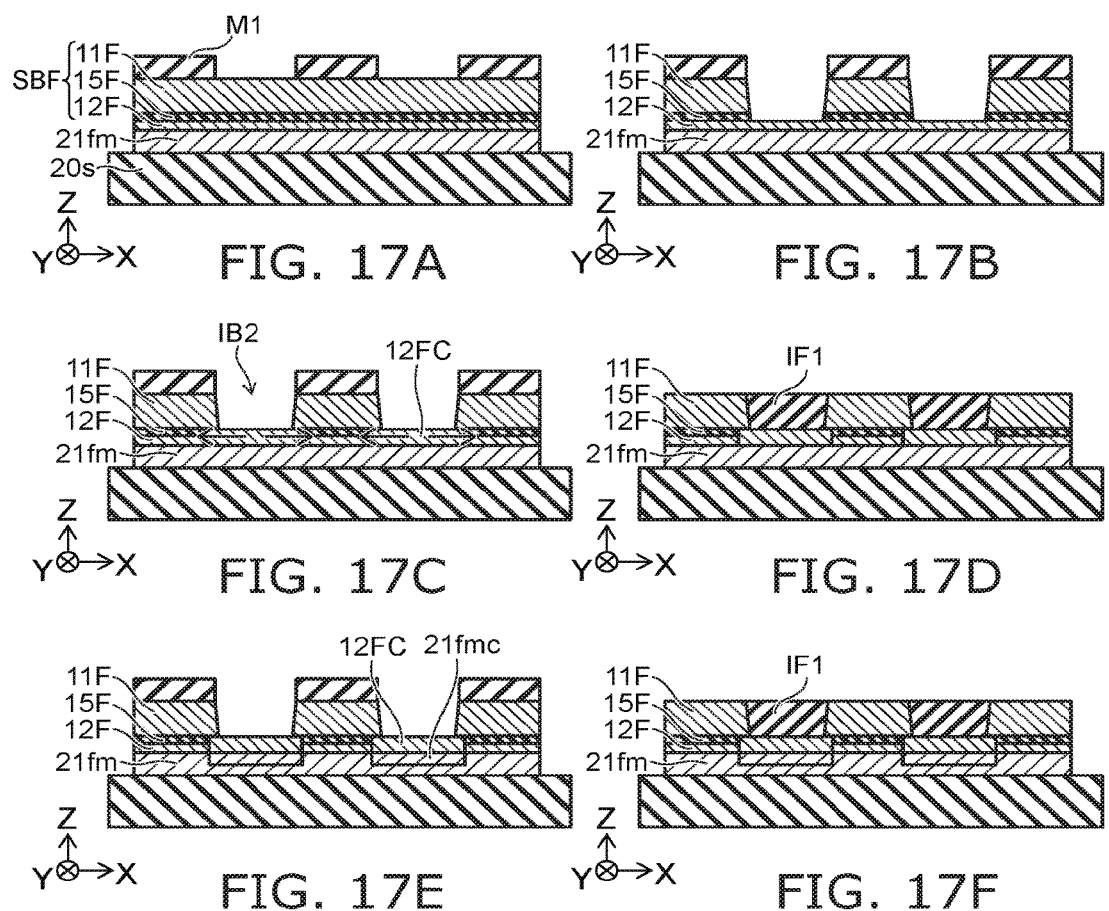

MAGNETIC MEMORY DEVICE

CROSS-REFERENCE TO RELATED APPLICATIONS

This application is based upon and claims the benefit of priority from Japanese Patent Application No. 2016-154040, filed on Aug. 4, 2016; the entire contents of which are incorporated herein by reference.

FIELD

Embodiments described herein relate generally to a magnetic memory device.

BACKGROUND

It is desirable to increase the bit density of a magnetic memory device.

BRIEF DESCRIPTION OF THE DRAWINGS

FIG. 17A to FIG. 17F are schematic cross-sectional views illustrating the method for manufacturing another magnetic memory device according to the second embodiment;

DETAILED DESCRIPTION

Figure 1A:
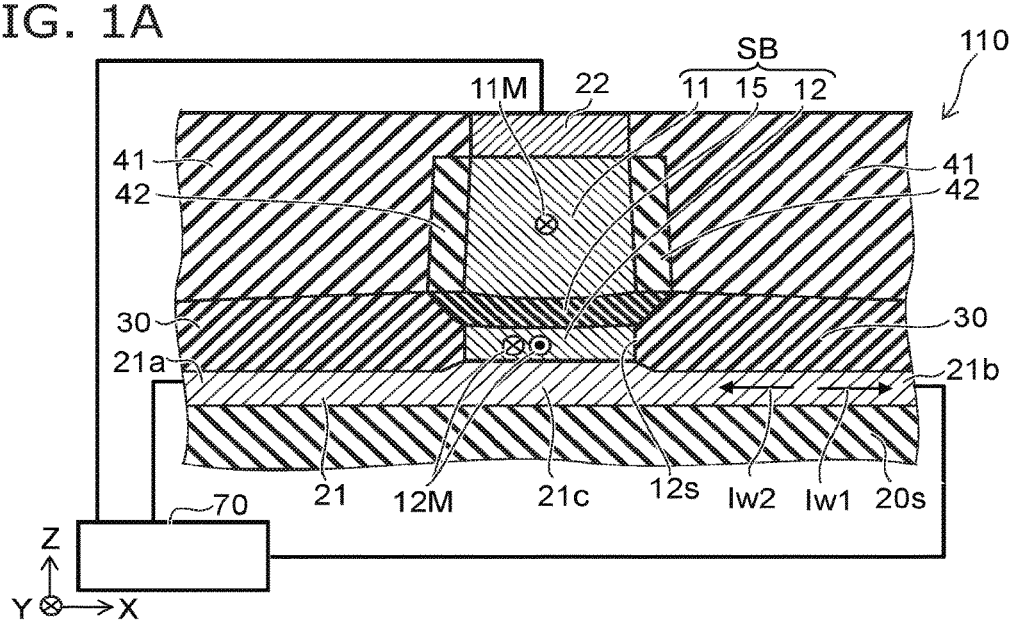
FIG. 1A to FIG. 1C are schematic cross-sectional views illustrating a magnetic memory device according to a first embodiment.

According to one embodiment, a magnetic memory device includes a metal-containing layer including a metallic element, a first magnetic layer, a second magnetic layer, and a first intermediate layer. The second magnetic layer is provided between the first magnetic layer and a portion of the metal-containing layer. The first intermediate layer includes a portion provided between the first magnetic layer and the second magnetic layer. The first intermediate layer is nonmagnetic. The first intermediate layer is convex toward the metal-containing layer.

According to another embodiment, a magnetic memory device includes a metal-containing layer including a metallic element, a first magnetic layer, a second magnetic layer, and a first intermediate layer. The second magnetic layer is provided between the first magnetic layer and a portion of the metal-containing layer. The first intermediate layer includes an inner portion and an outer edge portion. At least a part of the inner portion is provided between the first magnetic layer and the second magnetic layer. The outer edge portion is around the inner portion. The first intermediate layer is nonmagnetic. The first magnetic layer has a first surface and a second surface. The first surface opposes the first intermediate layer. The second surface is on a side opposite to the first surface. In a direction from the second magnetic layer toward the first magnetic layer, a first distance between the second surface and the outer edge portion is shorter than a second distance between the second surface and the inner portion.

According to another embodiment, a magnetic memory device includes a metal-containing layer including a metallic element, a first magnetic layer, a second magnetic layer, and a first intermediate layer. The second magnetic layer is provided between the first magnetic layer and a portion of the metal-containing layer. The first intermediate layer includes an inner portion and an outer edge portion. At least a part of the inner portion is provided between the first magnetic layer and the second magnetic layer. The outer edge portion is around the inner portion. The first intermediate layer is nonmagnetic. The first intermediate layer is crystalline. The first intermediate layer includes an inner portion and an outer edge portion. The outer edge portion is around the inner portion. A first lattice length along one direction of the outer edge portion is different from a second lattice length along the one direction of the inner portion.

According to another embodiment, a method for manufacturing a magnetic memory device is disclosed. The method can include forming a structure body. The structure body includes a metal film, a first magnetic layer, a second magnetic layer provided between the first magnetic layer and a portion of the metal film, and a first intermediate layer including a portion provided between the first magnetic layer and the second magnetic layer. The first intermediate layer is nonmagnetic. The first intermediate layer protrudes in a direction crossing a first direction when referenced to the second magnetic layer. The first direction is from the second magnetic layer toward the first magnetic layer. The method can include forming a compound layer including a metallic element included in the metal film by processing a surface of another portion of the metal film. A portion of the compound layer is between the metal film and the first intermediate layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
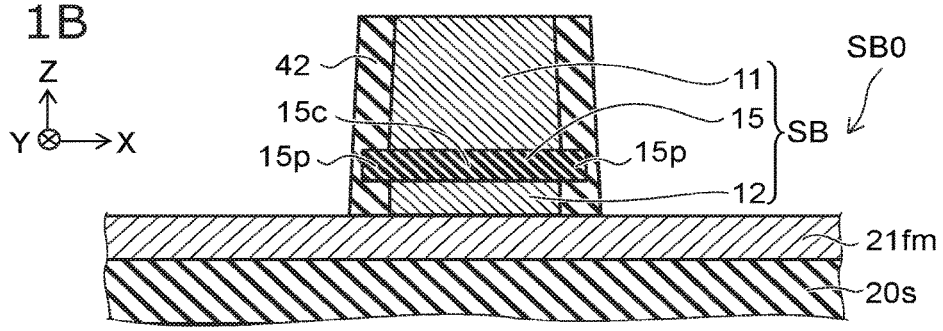
Figure 1C:
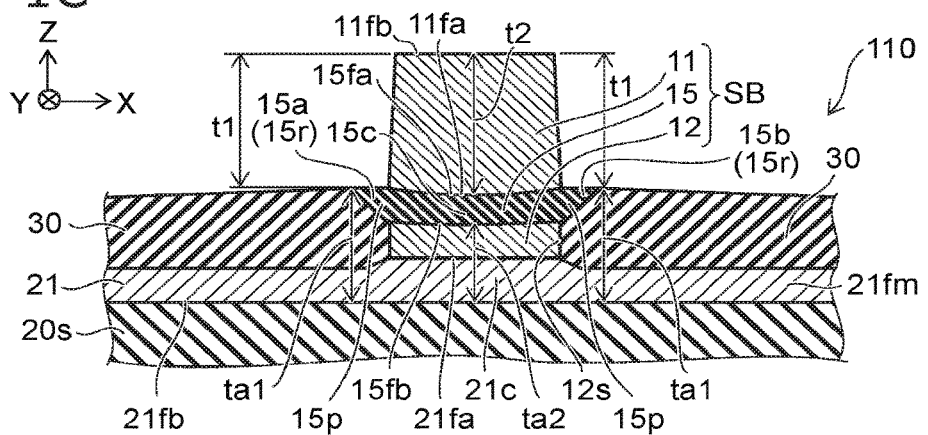

FIG. 1A to FIG. 1C are schematic cross-sectional views illustrating a magnetic memory device according to a first embodiment.

FIG. 1B illustrates an intermediate state of the manufacturing processes of the magnetic memory device 110 according to the embodiment. A portion of the components described in FIG. 1A are not illustrated in FIG. 1C.

As shown in FIG. 1A, the magnetic memory device 110 according to the embodiment includes a metal-containing layer 21, a first magnetic layer 11, a second magnetic layer 12, and a first intermediate layer 15. The first magnetic layer 11, the second magnetic layer 12, and the first intermediate layer 15 are included in a stacked body SB.

The metal-containing layer 21 includes a metallic element. The metal-containing layer 21 includes, for example, tantalum. Examples of the material of the metal-containing layer 21 are described below.

The second magnetic layer 12 is provided between the first magnetic layer 11 and a portion 21c of the metal-containing layer 21. The first intermediate layer 15 is provided between the first magnetic layer 11 and the second magnetic layer 12. The first intermediate layer 15 is nonmagnetic. The first intermediate layer 15 includes, for example, MgO. Examples of the materials of the first magnetic layer 11, the second magnetic layer 12, and the first intermediate layer 15 are described below.

A first direction from the second magnetic layer 12 toward the first magnetic layer 11 is taken as a Z-axis direction. One direction perpendicular to the Z-axis direction is taken as an X-axis direction. A direction perpendicular to the Z-axis direction and the X-axis direction is taken as a Y-axis direction. The first direction corresponds to the stacking direction of the stacked body SB.

A base layer 20s and an electrode 22 are provided in the example. The electrode 22 is separated from the base layer 20s in the first direction. The metal-containing layer 21 is provided between at least a portion of the base layer 20s and at least a portion of the electrode 22. The stacked body SB is provided between the electrode 22 and the portion 21c of the metal-containing layer 21. The electrode 22 may be, for example, a capping layer.

For example, the base layer 20s may be at least a portion of a substrate. The base layer 20s is, for example, insulative. The base layer 20s may include, for example, a substrate including aluminum oxide, etc.

For example, the electrode 22 is electrically connected to the first magnetic layer 11.

For example, the stacked body SB functions as a magnetic variable resistance element. For example, the TMR (Tunnel Magneto Resistance Effect) occurs in the stacked body SB. For example, the electrical resistance of a path including the first magnetic layer 11, the first intermediate layer 15, and the second magnetic layer 12 changes according to the difference between the orientation of a first magnetization 11M of the first magnetic layer 11 and the orientation of a second magnetization 12M of the second magnetic layer 12. The stacked body SB includes, for example, a magnetic tunnel junction (MTJ).

For example, the first magnetization 11M of the first magnetic layer 11 is substantially fixed. On the other hand, the direction of the second magnetization 12M of the second magnetic layer 12 is changeable. The first magnetic layer 11 is, for example, a reference layer. The second magnetic layer 12 is, for example, a free layer. The second magnetic layer 12 is, for example, a memory layer.

For example, the second magnetic layer 12 functions as a layer that stores information. For example, a first state (a first write state) in which the second magnetization 12M is oriented in one direction corresponds to first information to be stored.

A second state (a second write state) in which the second magnetization 12M is oriented in another direction corresponds to second information to be stored. For example, the first information corresponds to one of "0" or "1." The second information corresponds to the other of "0" or "1."

For example, the second magnetization 12M of the second magnetic layer 12 can be controlled by a current flowing in the metal-containing layer 21. In such a case, a current (a write current) is caused to flow in the metal-containing layer 21; and the orientation of the second magnetization 12M can be controlled by the orientation of the current.

For example, the metal-containing layer 21 includes a first portion 21a and a second portion 21b. The direction from the first portion 21a toward the second portion 21b is taken as a second direction. The second portion 21b is arranged with the first portion 21a in the second direction. The second direction crosses the first direction (the Z-axis direction). The second direction is, for example, the X-axis direction. The portion 21c of the metal-containing layer 21 recited above is positioned between the first portion 21a and the second portion 21b. A current flows in a path including the first portion 21a, the portion 21c, and the second portion 21b.

A controller 70 (a control circuit or a drive circuit) is further provided in the example. The current is supplied by the controller 70.

For example, the controller 70 is electrically connected to the first portion 21a and the second portion 21b. In the first write operation, the controller 70 supplies a first write current Iw1 to the metal-containing layer 21. Thereby, the first state is formed. The first write current Iw1 is from the first portion 21a toward the second portion 21b. In the second write operation, the controller 70 supplies a second write current Iw2 to the metal-containing layer 21. Thereby, the second state is formed. The second write current Iw2 is from the second portion 21b toward the first portion 21a. Thus, the controller 70 can implement the write operation (or the erase operation). The electrical resistance of the stacked body SB is different between these two states. These write operations are, for example, memory operations.

The change of the electrical resistance may be sensed by the controller 70. For example, the controller 70 is further electrically connected to the first magnetic layer 11. In the example, the controller 70 is electrically connected to the electrode 22. For example, in the read operation, the controller 70 senses the change of the characteristics (the voltage, etc.) based on the change of the electrical resistance between the first magnetic layer 11 and the first portion 21*a*. A first electrical resistance between the first magnetic layer 11 and the first portion 21*a* in the first state is different from a second electrical resistance between the first magnetic layer 11 and the first portion 21*a* in the second state. In other words, the first electrical resistance between the first magnetic layer 11 and the first portion 21*a* after the first write operation is different from the second electrical resistance between the first magnetic layer 11 and the first portion 21*a* after the second write operation. In the description recited above, the first portion 21*a* and the second portion 21*b* are interchangeable with each other. For example, the electrical resistance recited above may be the electrical resistance between the first magnetic layer 11 and the second portion 21*b*.

A first insulating layer 41, a second insulating layer 42, and a compound layer 30 are further provided in the example. At least a portion of the first insulating layer 41 is arranged with the first magnetic layer 11 in the X-Y plane. For example, at least a portion of the first insulating layer 41 is arranged with the first magnetic layer 11 in the X-axis direction. The second insulating layer 42 is provided between the first magnetic layer 11 and the first insulating layer 41. The first insulating layer 41 includes, for example, an insulator such as silicon oxide, aluminum oxide, etc. The second insulating layer 42 includes, for example, an oxide of a metallic element included in the stacked body SB, etc. As described below, for example, the second insulating layer 42 is formed when patterning the stacked body SB.

The compound layer 30 is provided between the metal-containing layer 21 and the first insulating layer 41. For example, the compound layer 30 overlaps at least a portion of the second magnetic layer 12 in the X-axis direction. The compound layer 30 further overlaps at least a portion of the first intermediate layer 15 in the X-axis direction. A portion of the compound layer 30 is between the metal-containing layer 21 and a portion of the first intermediate layer 15 in the Z-axis direction. For example, the compound layer 30 opposes a side surface 12*s* of the second magnetic layer 12. For example, the side surface 12*s* crosses the X-axis direction.

The compound layer 30 is, for example, a compound including the metallic element included in the metal-containing layer 21. As described below, the compound layer 30 may be formed by changing a portion of the surface of a metal film used to form the metal-containing layer 21 by oxidization, etc. For example, in the case where the metal-containing layer 21 includes tantalum, the compound layer 30 includes tantalum oxide.

In the embodiment, the first intermediate layer 15 is convex toward the metal-containing layer 21. For example, the first intermediate layer 15 is convex toward the second magnetic layer 12. For example, in FIG. 1A, the first intermediate layer 15 has an upper surface (a surface 15*fa* described below referring to FIG. 1C). The central portion of the upper surface is positioned lower when referenced to the outer edge of the upper surface. The first intermediate layer 15 has a lower surface (a surface 15*fb* described below referring to FIG. 1C). The central portion of the lower surface is positioned lower when referenced to the outer edge of the lower surface. For example, the state in which the first intermediate layer 15 is convex toward the metal-containing layer 21 includes at least one of the state of the upper surface recited above or the state of the lower surface recited above.

By such a configuration, for example, the write error rate (WER) of the write operation (the memory operation) of the information can be low. It is considered that this is because the second magnetization 12M of the second magnetic layer 12 is easily controlled to be in the desired state by such a configuration.

For example, in one example of the embodiment, the second magnetization 12M is oriented in one of the +Y direction or the −Y direction. In such a case, if the second magnetization 12M becomes oriented in a direction other than these directions, the information to be stored is easily recorded erroneously. For example, if the thermal stability is insufficient, there are cases where the orientation of the second magnetization 12M is no longer in the desired direction. Thereby, a write error rate WER degrades.

Further, multiple stacked bodies (memory cells) are provided in the memory device. When the pitch of the multiple stacked bodies becomes small, there are cases where another stacked body positioned adjacent to the stacked body of interest affects the stacked body of interest. For example, there are cases where a leakage magnetic field from the adjacent memory cell reduces the stability of the second magnetization 12M. This limits the increase of the bit density of the memory device. In other words, the write error rate WER degrades if the bit density is increased.

Conversely, in the embodiment, the write error rate WER can be improved by a special structure such as that recited above.

For example, the first intermediate layer 15 is convex toward the metal-containing layer 21. By such a structure, for example, it is considered that stress is applied to the second magnetic layer 12. For example, an inverse magnetostrictive effect (a Villari effect) occurs due to the strain based on the stress.

Thereby, for example, the fluctuation (e.g., the fluctuation) of the coercivity of the second magnetic layer 12 is suppressed. For example, a high retention energy is obtained; and the retention characteristics (the retention durability) can be improved.

For example, it is considered that the direction of the second magnetization 12M is easily controlled to be in some range by the inverse magnetostrictive effect. Thereby, for example, it is considered that the direction of the second magnetization 12M is easily aligned in the desired direction (e.g., one of the +Y direction or the −Y direction). The direction of the second magnetization 12M is strongly oriented in the desired direction (e.g., the +Y direction and the −Y direction). The retention energy increases.

As a result, according to the embodiment, it is considered that the write error rate WER can be improved. Thereby, the bit density can be increased.

For example, it is considered that stress is applied to the first intermediate layer 15 and the second magnetic layer 12 by the compound layer 30. Thereby, a force is applied to cause the first intermediate layer 15 to be convex toward the metal-containing layer 21. In particular, the first intermediate layer 15 bends greatly at the outer edge portion (the vicinity of a first end portion 15*a* and a second end portion 15*b* described below). Also, it is considered that the stress is applied to the second magnetic layer 12.

An example of the state in which the compound layer 30 is formed will now be described.

As shown in FIG. 1B, a metal film 21*fm* that is used to form the metal-containing layer 21 is provided on the base layer 20*s*; and a stacked film that is used to form the second magnetic layer 12, the first intermediate layer 15, and the first magnetic layer 11 is formed on the metal film 21*fm*. Then, the stacked film is patterned by a method such as, for example, ion milling, etc. Thereby, a structure body SB0 that includes the metal film 21*fm*, the second magnetic layer 12, the first intermediate layer 15, and the first magnetic layer 11 is formed.

At this time, reactants of the elements included in these magnetic layers may adhere to the side walls of these magnetic layers and the first intermediate layer 15. The adhered reactants correspond to the second insulating layer 42 recited above.

Figures 11A, 11B:
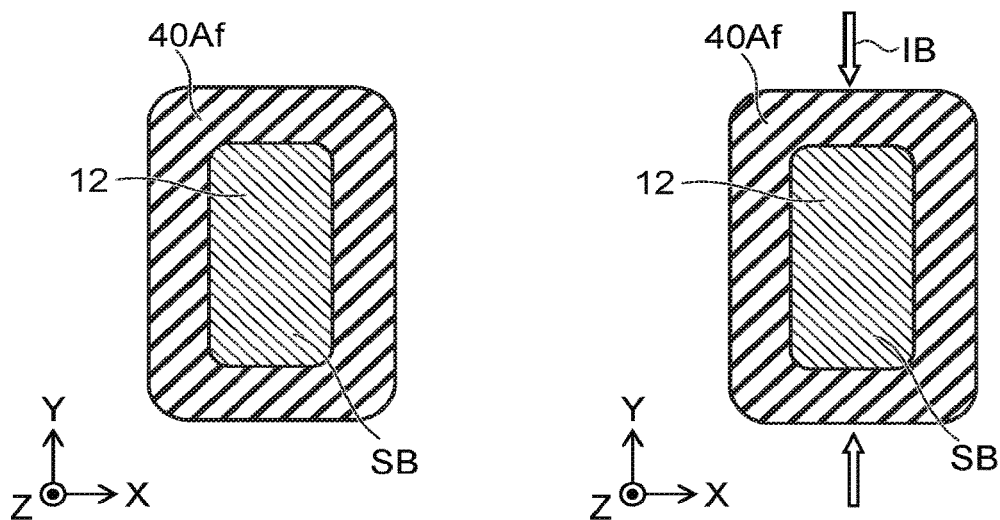
FIG. 11A and FIG. 11B are schematic cross-sectional views illustrating a method for manufacturing another magnetic memory device according to the second embodiment.

As shown in FIG. 11B, the width of the first intermediate layer 15 can be set to be wider than the width of at least a portion of the second magnetic layer 12. For example, such a width can be formed by the etching rate of the film used to form the first intermediate layer 15 being lower than the etching rate of the magnetic layers. The width is the length in a direction crossing the Z-axis direction and is, for example, the length along the X-axis direction. A protruding portion 15*p* is formed in the first intermediate layer 15. Thus, the first intermediate layer 15 protrudes in a direction crossing the first direction (the Z-axis direction) when referenced to the second magnetic layer 12, where the first direction (the Z-axis direction) is from the second magnetic layer 12 toward the first magnetic layer 11.

Subsequently, for example, the surface of the metal film 21*fm* used to form the metal-containing layer 21 is processed. The processing is, for example, oxygen plasma processing. Thereby, the compound layer 30 is formed from a portion of the metal film 21*fm*. The remaining metal film 21*fm* becomes the metal-containing layer 21. A portion of the surface of the metal film 21*fm* changes due to the processing. In the case where the thickness of the metal film 21*fm* is about 5 nm, the thickness of the portion that changes is, for example, about 1 nm. In the case where the thickness of the portion that changes is about 1 nm, the thickness of the compound layer 30 formed by the change is about 4 nm. Expansion occurs in the formation process of the compound layer 30.

Therefore, the compound layer 30 applies a force (stress) to the other layers positioned around the compound layer 30. The protruding portion 15*p* of the first intermediate layer 15 is pushed upward toward the upper side by the stress. Thereby, the protruding portion 15*p* is positioned on the upper side relative to an inner portion 15*c*. Thereby, the first intermediate layer 15 becomes convex toward the metal-containing layer 21 as an entirety.

On the other hand, the stress from the compound layer 30 is applied to the second magnetic layer 12. Thereby, strain is generated in the second magnetic layer 12. The controllability of the second magnetization 12M of the second magnetic layer 12 increases due to the strain. Thereby, the write error rate WER can be improved. For example, the effects of the adjacent cells can be suppressed; and as a result, the bit density can be increased.

The first insulating layer 41, the second insulating layer 42, and the electrode 22 are not illustrated in FIG. 1C. As shown in FIG. 1C, the compound layer 30 is provided in the embodiment. For example, the compound layer 30 includes at least one selected from the group consisting of an oxide of a metallic element included in the metal-containing layer 21, a nitride of the metallic element, and an oxynitride of the metallic element.

The first intermediate layer 15 includes the protruding portion 15*p*. For example, the protruding portion 15*p* does not overlap the second magnetic layer 12 in the first direction (the direction from the second magnetic layer 12 toward the first magnetic layer 11). For example, the protruding portion 15*p* does not overlap the first magnetic layer 11 in the first direction. At least a portion of the compound layer 30 is between the metal-containing layer 21 and the protruding portion 15*p* in the first direction (the Z-axis direction).

Thus, at least a portion of the compound layer 30 is between the metal-containing layer 21 and a portion (the protruding portion 15*p*) of the first intermediate layer 15. Thereby, the stress is applied to the protruding portion 15*p*; and the first intermediate layer 15 becomes convex toward the metal-containing layer 21. Also, the stress is applied to the second magnetic layer 12 by the compound layer 30 positioned between the metal-containing layer 21 and the protruding portion 15*p*. The controllability of the second magnetization 12M increases.

For example, in the embodiment, the compound layer 30 contacts the second magnetic layer 12. As described in reference to FIG. 1B, there are cases where a film that is used to form the second insulating layer 42 adheres to the side wall of the second magnetic layer 12 partway through the manufacturing processes. In such a case, a portion of the second insulating layer 42 may mix with a compound including a metallic element included in the metal-containing layer 21 due to the processing (e.g., plasma processing) for forming the compound layer 30. Such a mixture also may be included in the compound layer 30. In such a case as well, the compound layer 30 contacts the second magnetic layer 12.

In the embodiment as shown in FIG. 1C, for example, the first intermediate layer 15 has the surface 15*fa* opposing the first magnetic layer 11. The opposing surface 15*fa* recedes toward the metal-containing layer 21.

As described above, for example, the second magnetic layer 12 has the side surface 12*s* crossing the second direction (the X-axis direction). The compound layer 30 opposes the side surface 12*s* in the second direction. Thereby, the stress that is due to the compound layer 30 is applied effectively to the second magnetic layer 12.

As shown in FIG. 1C, the first intermediate layer 15 includes the inner portion 15*c* and an outer edge portion 15*r*. The outer edge portion 15*r* is provided around the inner portion 15*c*. At least a part of the inner portion 15*c* is provided between the first magnetic layer 11 and the second magnetic layer 12.

The first magnetic layer 11 has a first surface 11*fa* and a second surface 11*fb*. The first surface 11*fa* opposes the first intermediate layer 15. The second surface 11*fb* is a surface on the side opposite to the first surface 11*fa*. The second surface 11*fb* is, for example, the upper surface of the first magnetic layer 11. The first surface 11*fa* is the lower surface of the first magnetic layer 11.

In the first direction (the direction from the second magnetic layer 12 toward the first magnetic layer 11), a first distance t1 (the shortest distance) between the second surface 11*fb* and the outer edge portion 15*r* is shorter than a second distance t2 (the shortest distance) between the second surface 11*fb* and the inner portion 15*c*. For example, the first distance t1 (the shortest distance) between the position in the first direction of the second surface 11*fb* and the position in the first direction of the outer edge portion 15*r* is shorter than the second distance t2 (the shortest distance)

between the position in the first direction of the second surface 11fb and the position in the first direction of the inner portion 15c.

In the example, the outer edge portion 15r includes the first end portion 15a and the second end portion 15b. The second end portion 15b is arranged with the first end portion 15a in the second direction. The second direction is a direction crossing the first direction and is, for example, the X-axis direction.

The first distance t1 is, for example, the distance along the first direction (the Z-axis direction) between the first end portion 15a and the second surface 11fb. The first distance t1 may be, for example, the distance along the first direction (the Z-axis direction) between the second end portion 15b and the second surface 11fb.

On the other hand, the metal-containing layer 21 has a surface 21fb (e.g., the lower surface) opposing the base layer 20s. The metal-containing layer 21 has a surface 21fa opposing the second magnetic layer 12. The surface 21fb is the surface on the side opposite to the surface 21fa.

A distance ta1 along the first direction between the surface 21fb (e.g., the lower surface) and the outer edge portion 15r of the first intermediate layer 15 is longer than a distance ta2 along the first direction between the surface 21fb and the inner portion 15c of the first intermediate layer 15.

For example, the first intermediate layer 15 has the surface 15fb opposing the second magnetic layer 12. For example, the surface 15fb is convex toward the metal-containing layer 21.

In the embodiment, for example, the first intermediate layer 15 is curved and does not have a planar configuration. It is considered that there is a relationship between such a configuration and the stress applied to the second magnetic layer 12.

In the magnetic memory device 110 according to the embodiment, the lattice length may be different between locations in the first intermediate layer 15.

Figure 2:
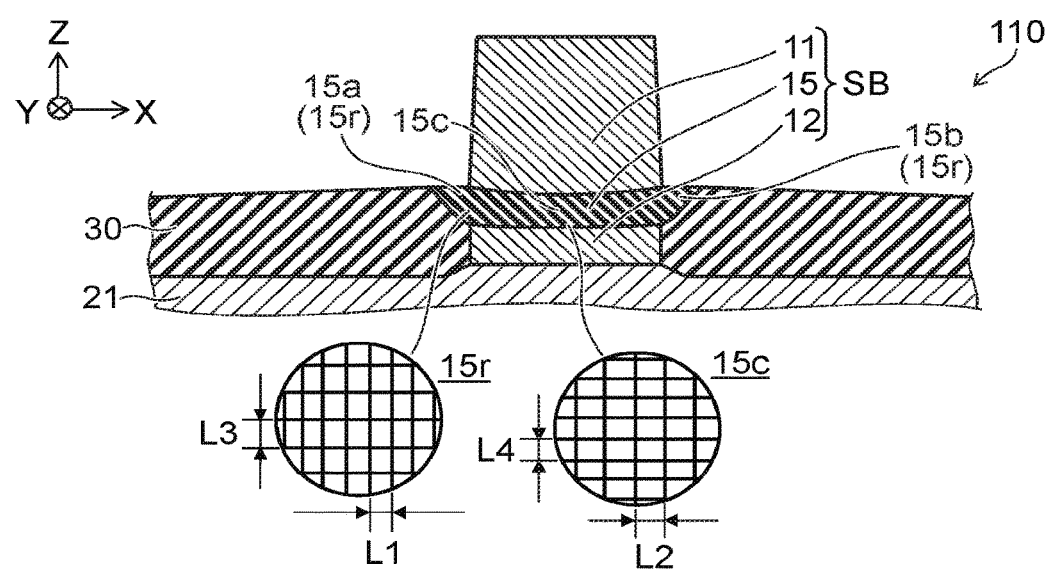
FIG. 2 is a schematic cross-sectional view illustrating the magnetic memory device according to the first embodiment.

FIG. 2 is a schematic cross-sectional view illustrating the magnetic memory device according to the first embodiment.

FIG. 2 illustrates the lattice lengths of the first intermediate layer 15 of the magnetic memory device 110 according to the embodiment. For easier viewing of the drawing in FIG. 2, the difference between the lattice lengths by location is shown as being enhanced.

For example, the lattice length is the distance between two mutually-adjacent lattice planes. For example, the lattice length is the spacing of the lattice in one direction aligned with the X-Y plane. The one direction is, for example, the second direction recited above (e.g., the X-axis direction). For example, the second end portion 15b of the outer edge portion 15r is arranged with the first end portion 15a of the outer edge portion 15r in the second direction. The inner portion 15c is positioned between the first end portion 15a and the second end portion 15b in the second direction. The first intermediate layer 15 is crystalline.

In the embodiment, a first lattice length L1 along one direction of the outer edge portion 15r is different from a second lattice length L2 of the inner portion 15c along the one direction recited above. For example, the first lattice length L1 along the second direction (e.g., the X-axis direction) of the outer edge portion 15r is different from the second lattice length L2 along the second direction of the inner portion 15c.

For example, when the first lattice length L1 is different from the second lattice length L2, it is considered that strain is generated in the second magnetic layer 12. For example, there is a relationship between the strain of the second magnetic layer 12 and the difference by location of the lattice lengths of the first intermediate layer 15.

For example, the lattice length of the second magnetic layer 12 may be different between positions inside the second magnetic layer 12. There are cases where the composition of the second magnetic layer 12 is complex. There are cases where the second magnetic layer 12 has a polycrystalline structure or an amorphous structure. In such a case, it may be difficult to evaluate the lattice length of the second magnetic layer 12. On the other hand, there are cases where the evaluation of the lattice length of the first intermediate layer 15 is easy compared to the evaluation of the lattice length of the second magnetic layer 12. The state of the strain of the second magnetic layer 12 can be estimated from the evaluation result of the state of the lattice length of the first intermediate layer 15.

For example, the lattice length can be evaluated based on a TEM image, etc. For example, information relating to the size relationship of the lattice length can be obtained from the results of a Fourier transform of the lattice image obtained from the TEM image. For example, the Fourier transform is performed on the crystal plane (i.e., the lattice plane).

In the embodiment, for example, the ratio of the absolute value of the difference between the first lattice length L1 and the second lattice length L2 to the first lattice length L1 is 1% or more. Thereby, for example, the second magnetization 12M of the second magnetic layer 12 is easily controlled to be in the desired state. The write error rate WER can be improved. Thereby, a magnetic memory device can be provided in which the bit density can be increased.

In the embodiment, a third lattice length L3 along the first direction (the Z-axis direction) of the outer edge portion 15r may be different from a fourth lattice length L4 along the first direction (the Z-axis direction) of the inner portion 15c (referring to FIG. 2).

For example, in the TEM image, the lattice spacing is read from the Fourier transform of the lattice image of the first intermediate layer 15. The lattice spacing that is read at the outer edge portion 15r is greater than the lattice spacing read at the inner portion 15c by about 1%. From the perspective of Poisson's ratio, it is considered that the difference of the lattice spacing corresponds to the first intermediate layer 15 contracting in the in-plane direction. For example, in the case of the MgO (200) plane, the fourth lattice spacing L4 is greater than 0.207 nm in the case where the third lattice spacing L3 is 0.205 nm.

Figure 3A:
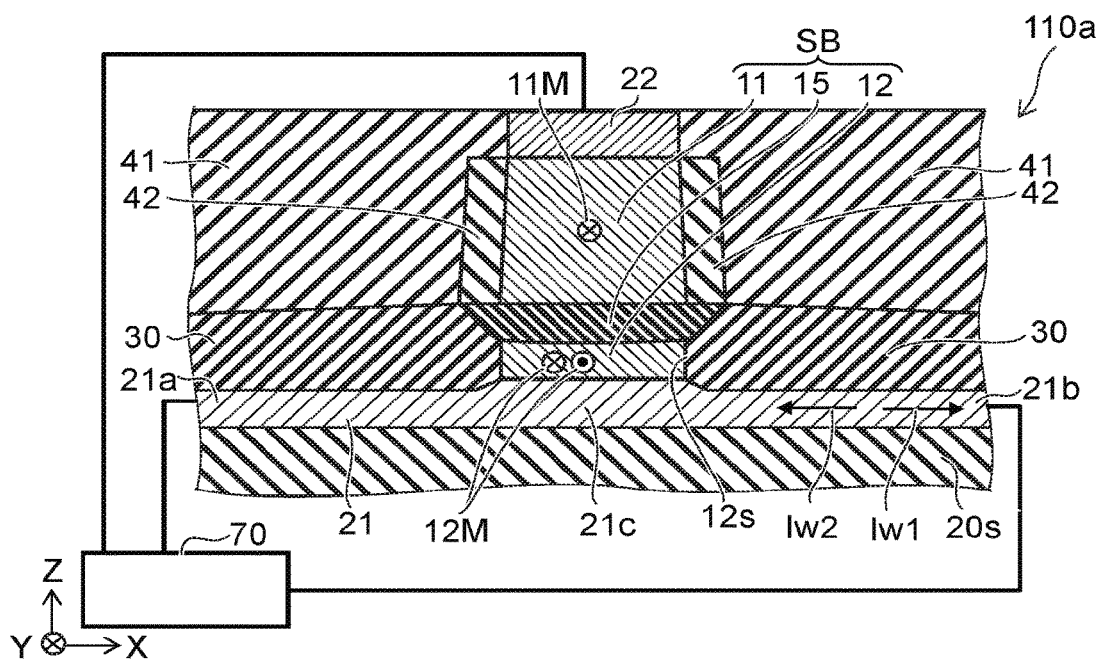
FIG. 3A and FIG. 3B are schematic cross-sectional views illustrating another magnetic memory device according to the first embodiment.
Figure 3B:
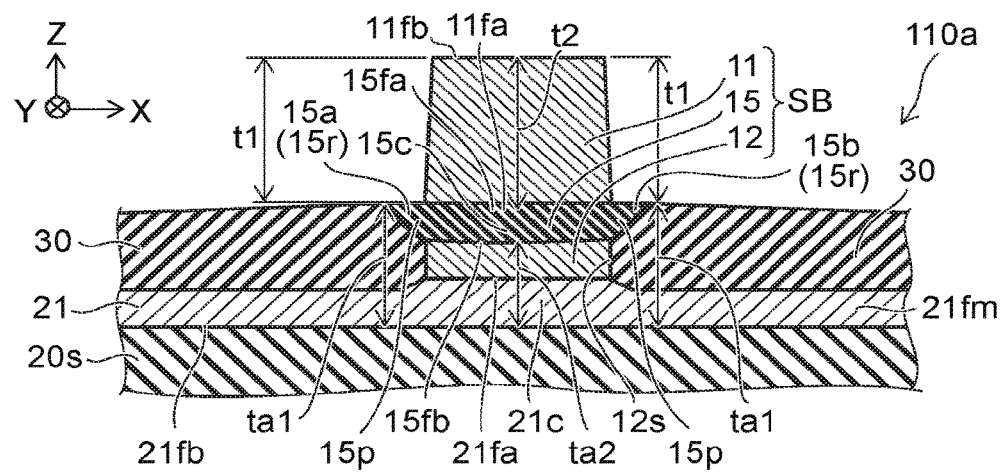

FIG. 3A and FIG. 3B are schematic cross-sectional views illustrating another magnetic memory device according to the first embodiment.

Some of the components described in FIG. 3A are not illustrated in FIG. 3B.

The other magnetic memory device 110a according to the embodiment also includes the metal-containing layer 21, the first magnetic layer 11, the second magnetic layer 12, and the first intermediate layer 15. In the magnetic memory device 110a, the outer edge portion 15r of the protruding portion 15p of the first intermediate layer 15 is bent upward; and the central portion (the inner portion 15c) of the first intermediate layer 15 is substantially aligned with the X-Y plane. Otherwise, the magnetic memory device 110a is similar to the magnetic memory device 110. In the magnetic memory device 110a as well, the write error rate WER can be improved; and the bit density can be increased.

Figure 4:
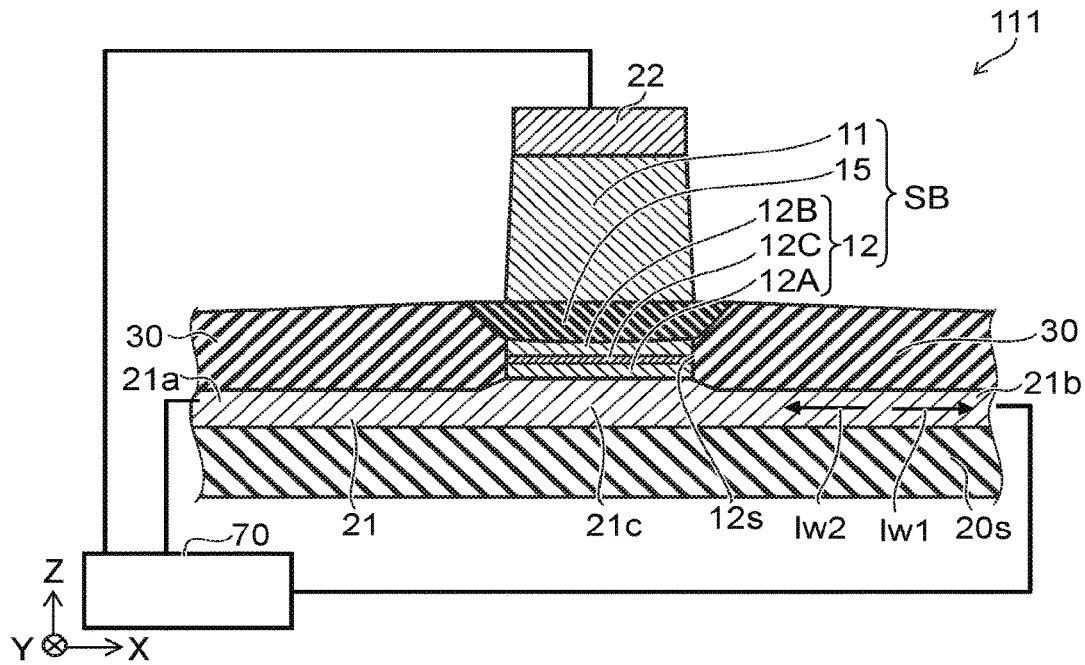
FIG. 4 is a schematic cross-sectional view illustrating another magnetic memory device according to the first embodiment.

FIG. 4 is a schematic cross-sectional view illustrating another magnetic memory device according to the first embodiment.

The first insulating layer 41 and the second insulating layer 42 are not illustrated in FIG. 4. The portions of the magnetic memory device 111 that are different from the magnetic memory device 110 will now be described.

In the other magnetic memory device 111 according to the embodiment as shown in FIG. 4, the second magnetic layer 12 includes a first magnetic film 12A, a second magnetic film 12B, and a first intermediate film 12C. The second magnetic film 12B is provided between the first magnetic film 12A and the first intermediate layer 15. The first intermediate film 12C is provided between the first magnetic film 12A and the second magnetic film 12B. For example, the second magnetic film 12B is antiferromagnetically coupled to the first magnetic film 12A.

The first intermediate film 12C includes, for example, Ru. For example, the thickness of the first intermediate film 12C is controlled appropriately. For example, the thickness of the first intermediate film 12C may be controlled to correspond to the second peak or the first peak of RKKY (Ruderman-Kittel-Kasuya-Yosida) coupling. Antiferromagnetic coupling occurs between the first magnetic film 12A and the second magnetic film 12B due to the appropriate control of the thickness of the first intermediate film 12C. Due to the antiferromagnetic coupling, for example, the demagnetizing field of the magnetic layer at the element end portion is reduced by coupling in which the polarities are the reverse of each other. Due to the antiferromagnetic coupling, the leakage magnetic field from the second magnetic layer 12 can be small. Thereby, the distance between the multiple memory cells can be set to be short. For example, the bit density can be increased.

If the antiferromagnetic coupling is caused to occur in the second magnetic layer 12, it is difficult to obtain shape magnetic anisotropy in the second magnetic layer 12. The stability of the second magnetization 12M of the second magnetic layer 12 decreases easily. In such a case, in the embodiment, the second magnetization 12M can be easily controlled to be in the desired state by the special structure of the first intermediate layer 15 recited above. Thereby, the direction of the second magnetization 12M can be easily controlled to be in the desired direction even in the case where the antiferromagnetic coupling is caused to occur in the second magnetic layer 12. Thereby, for example, more stable operations are possible even when the bit density is increased.

In the embodiment, ferromagnetic coupling is obtained between the first magnetic film 12A and the second magnetic film 12B according to the thickness of the first intermediate film 12C. In such a case, the second magnetization 12M of the second magnetic layer 12 is stabilized further.

As recited above, the first intermediate film 12C includes, for example, a nonmagnetic metal of a heavy element such as Ru, etc. For example, a portion of the write current flowing in the second magnetic layer 12 flows in the first intermediate film 12C. Thereby, torques in mutually-different directions act on the first magnetic film 12A and the second magnetic film 12B provided on and under the first intermediate film 12C. For example, spin-polarized electrons are reflected toward the first magnetic film 12A by the first intermediate film 12C. Thereby, the write current can be reduced. For example, a spin-orbit effect is obtained by the first intermediate film 12C.

In the write operation, the controller 70 applies a voltage between the metal-containing layer 21 and the first magnetic layer 11. In the example of FIG. 4, the voltage is applied between the metal-containing layer 21 and the first magnetic layer 11 by a voltage applied between the metal-containing layer 21 and the electrode 22. For example, the magnetization reversal energy of the second magnetic layer 12 decreases due to the application of the voltage because magnetic anisotropy is induced at the interface between the first intermediate layer 15 and the second magnetic layer 12. The configuration of the antiferromagnetic coupling or the ferromagnetic coupling is used by appropriately setting the thickness of the first intermediate film 12C. Thereby, compared to the case where there is no first intermediate film 12C, the reversal energy can be reduced in the second magnetic film 12B having the interface with the first intermediate layer 15. As a result, the recording current can be reduced further while maintaining the retention energy.

For example, in the case where the first intermediate film 12C includes Ru, the thickness of the first intermediate film 12C is not less than 0.2 nm and not more than 0.5 nm (the first peak), or not less than 0.8 nm and not more than 1.1 nm (the second peak). In such a case, antiferromagnetic coupling is obtained. In the case where the first intermediate film 12C includes Ru, the thickness of the first intermediate film 12C is not less than 0.6 nm and not more than 0.8 nm or not less than 1.2 nm. In such a case, ferromagnetic coupling is obtained. Rh, Ir, etc., may be used as the first intermediate film 12C.

Figure 5:
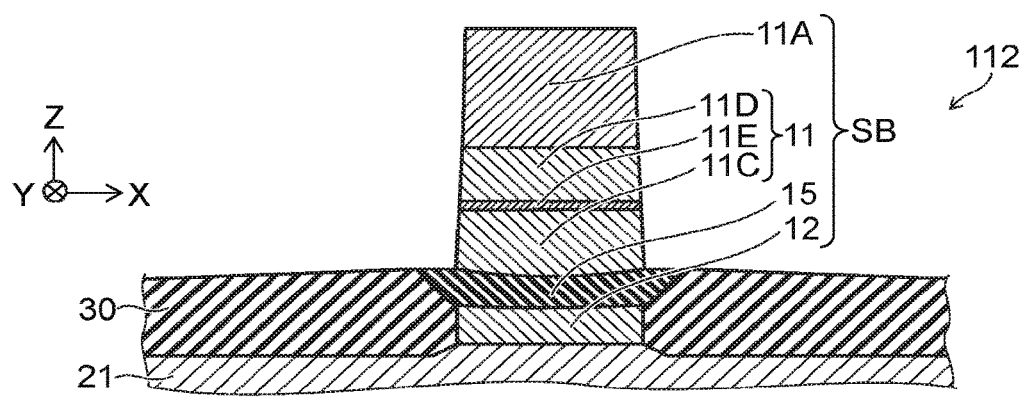
FIG. 5 is a schematic cross-sectional view illustrating another magnetic memory device according to the first embodiment.

FIG. 5 is a schematic cross-sectional view illustrating another magnetic memory device according to the first embodiment.

The base layer 20s, the electrode 22, the first insulating layer 41, the second insulating layer 42, and the controller 70 are not illustrated in FIG. 5. The portions of the magnetic memory device 112 that are different from the magnetic memory device 110 will now be described.

In the other magnetic memory device 112 according to the embodiment as shown in FIG. 5, the stacked body SB further includes an antiferromagnetic layer 11A. The first magnetic layer 11 is provided between the antiferromagnetic layer 11A and the first intermediate layer 15. In such a case, the antiferromagnetic layer 11A is provided between the electrode 22 (referring to FIG. 1A) and the first magnetic layer 11. The electrode 22 is electrically connected to the antiferromagnetic layer 11A. The antiferromagnetic layer 11A is electrically connected to the first magnetic layer 11.

The antiferromagnetic layer 11A includes, for example, IrMn. For example, the antiferromagnetic layer 11A fixes the first magnetization 11M of the first magnetic layer 11 in a direction crossing the Z-axis direction. The antiferromagnetic layer 11A is, for example, a pinning layer.

In the example, the first magnetic layer 11 includes a third magnetic film 11C, a fourth magnetic film 11D, and a second intermediate film 11E. The third magnetic film 11C is provided between the fourth magnetic film 11D and the first intermediate layer 15. The second intermediate film 11E is provided between the third magnetic film 11C and the fourth magnetic film 11D. The fourth magnetic film 11D includes, for example, CoFe. The second intermediate film 11E includes, for example, Ru. The third magnetic film 11C includes, for example, CoFeB. The thickness of the second intermediate film 11E is set to a thickness to magnetically couple the fourth magnetic film 11D and the second magnetic film 11C. As recited above, the third magnetic film 11C may include boron. Thereby, for example, a high MR ratio can be obtained in the stacked body SB. Thereby, the precision of the sensing of the write state of the information can be increased. Thereby, for example, the size of one memory cell can be reduced. Thereby, the bit density can be increased easily.

In the magnetic memory device 112 as well, the second magnetization 12M can be easily controlled to be in the desired state by the special structure of the first intermediate layer 15 recited above. A magnetic memory device can be provided in which the bit density can be increased.

In the magnetic memory device 112, the second magnetic layer 12 may include the first magnetic film 12A, the second magnetic film 12B, and the first intermediate film 12C.

Examples of the metal-containing layer 21, the first magnetic layer 11, the second magnetic layer 12, and the first intermediate layer 15 will now be described.

The metal-containing layer 21 may include, for example, a material having a high spin Hall effect. For example, the metal-containing layer 21 contacts the second magnetic layer 12. For example, the metal-containing layer 21 provides spin-orbit torque to the second magnetic layer 12. For example, the metal-containing layer 21 may function as a spin-orbit layer (SOL). For example, the orientation of the second magnetization 12M of the second magnetic layer 12 can be changed by the spin-orbit torque generated between the metal-containing layer 21 and the second magnetic layer 12. For example, the direction of the second magnetization 12M can be controlled according to the orientation of the current (the orientation of the first write current Iw1 or the orientation of the second write current Iw2) flowing through the metal-containing layer 21.

The metal-containing layer 21 includes, for example, at least one selected from the group consisting of tantalum and tungsten. The metal-containing layer 21 includes, for example, at least one selected from the group consisting of β-tantalum and β-tungsten. The spin Hall angles of these materials are negative. The absolute values of the spin Hall angles of these materials are large. Thereby, the second magnetization 12M can be controlled efficiently by the write current.

The metal-containing layer 21 may include at least one selected from the group consisting of platinum and gold. The spin Hall angles of these materials are positive. The absolute values of the spin Hall angles of these materials are large. Thereby, the second magnetization 12M can be controlled efficiently by the write current.

The direction (the orientation) of the spin-orbit torque applied to the second magnetic layer 12 is different according to the polarity of the spin Hall angle. For example, the metal-containing layer 21 provides spin-orbit interaction torque to the second magnetic layer 12. Thereby, for example, stable writing is easy.

The magnetic memory device that utilizes the spin Hall effect is, for example, spin-orbit torque random access memory (spin-orbit torque magnetic random access memory (SOT-MRAM)). In the SOT-MRAM, for example, the write current terminal and the read current terminal can be separated. For example, it is considered that the write error rate WER is reduced easily.

In the embodiment, the spin-transfer torque effect may be utilized. In such a case, the orientation of the magnetization is controlled by causing a current to flow in the stacked body SB along the stacking direction. Such a magnetic memory device is, for example, a spin-transfer torque random access memory (spin-transfer torque magnetic random access memory (STT-MRAM)). In the STT-MRAM, writing using a large current and reading using a small current are performed using the same terminals. In the STT-MRAM, for example, the metal-containing layer 21 may be used as one electrode in the write operation. The writing and the reading may be performed by causing currents to flow between the metal-containing layer 21 and the electrode 22.

In either the SOT-MRAM or the STT-MRAM, according to the embodiment, the controllability of the second magnetization 12M of the second magnetic layer 12 can be improved.

The second magnetic layer 12 is, for example, a free magnetic layer. The second magnetic layer 12 includes, for example, at least one of a ferromagnetic material or a soft magnetic material. The second magnetic layer 12 may include, for example, an artificial lattice.

For example, the ferromagnetic material recited above may have an $L1_0$ structure or an $L1_1$ structure. The second magnetic layer 12 includes, for example, at least one selected from the group consisting of FePd (iron-palladium), FePt (iron-platinum), CoPd (cobalt-palladium), and CoPt (cobalt-platinum). The soft magnetic material recited above includes, for example, CoFeB (cobalt-iron-boron). The artificial lattice recited above includes, for example, a stacked film including a first film and a second film. The first film includes, for example, at least one of NiFe (nickel-iron), Fe (iron), or Co (cobalt). The second film includes, for example, at least one of Cu (copper), Pd (palladium), or Pt (platinum). The first film is, for example, a magnetic material; and the second film is a nonmagnetic material.

The second magnetic layer 12 may include, for example, a ferrimagnetic material.

In the embodiment in the case where magnetization reversal due to spin-orbit torque is used, for example, the second magnetic layer 12 has in-plane magnetic anisotropy. Thereby, for example, polarized spin that is antiparallel to the magnetization direction can be obtained from the metal-containing layer 21. For example, the second magnetic layer 12 may have in-plane shape magnetic anisotropy and in-plane magneto-crystalline anisotropy.

In the embodiment, the second magnetic layer 12 may have perpendicular magnetic anisotropy. In such a case, for example, magnetization reversal can be performed using the polarized spin from the metal-containing layer 21 by an external magnetic field, etc.

It is favorable for the thermal agitation resistance of the second magnetic layer 12 to be high. A thermal agitation index $\Delta$ is represented by $$\Delta = K_u V/(K_B T) = (K_{shape} + K_{film}) V/(K_B T).$$

In the description recited above, "$K_u$" is the uniaxial magnetic anisotropy. "V" is the volume. "$K_{shape}$" is the shape magnetic anisotropy. "$K_{film}$" is the uniaxial magnetic anisotropy of the film.

For example, the volume V increases as the thickness of the second magnetic layer 12 is increased. In such a case, the magnitude of the uniaxial magnetic anisotropy changes due to the thickness.

For example, the second magnetic layer 12 may have a synthetic structure. In the synthetic structure, for example, the second magnetic layer 12 includes the first magnetic film 12A, the second magnetic film 12B, and the first intermediate film 12C (referring to FIG. 4). According to the thickness of the first intermediate film 12C (e.g., the Ru film), there are cases where ferromagnetic coupling is obtained in the second magnetic layer 12; or there are cases where antiferromagnetic coupling is obtained in the second magnetic layer 12.

When ferromagnetic coupling is used, for example, a high thermal agitation resistance can be obtained.

On the other hand, in the case where antiferromagnetic coupling is used, for example, the second magnetic layer 12 has a synthetic antiferromagnetic (SAF) structure. In such a structure, leakage magnetic fields are generated in mutuallyreverse directions. Therefore, the effects of the leakage magnetic fields on other proximal memory cells can be small. For example, the fluctuation of the coercivity can be small. The shape magnetic anisotropy is canceled in the SAF structure. Therefore, there are cases where it is difficult to set the thermal agitation resistance to be sufficiently high.

In the embodiment, the thermal agitation resistance can be improved by the special structure of the first intermediate layer 15 recited above. The embodiment is applicable to both the configuration using the ferromagnetic coupling and the configuration using the antiferromagnetic coupling.

The first intermediate layer 15 includes, for example, at least one selected from the group consisting of MgO (magnesium oxide), CaO (calcium oxide), SrO (strontium oxide), TiO (titanium oxide), VO (vanadium oxide), NbO (niobium oxide), and $Al_2O_3$ (aluminum oxide). The first intermediate layer 15 is, for example, a tunneling barrier layer. In the case where the first intermediate layer 15 includes MgO, the thickness of the first intermediate layer 15 is, for example, about 1 nm.

The first intermediate layer 15 may include one film of an oxide. The first intermediate layer 15 may include one film of a nitride. The first intermediate layer 15 may include a stacked film including multiple films.

For example, the MgO has a crystal structure of the NaCl (sodium chloride) structure. The first intermediate layer 15 may include, for example, a material ($MgAl_2O_4$, etc.) having a spinel crystal structure, etc.

The first magnetic layer 11 is, for example, a reference layer. The first magnetic layer 11 is, for example, a fixed magnetic layer. The first magnetic layer 11 includes, for example, Co (cobalt) or CoFeB (cobalt-iron-boron). In such a case, the antiferromagnetic layer 11A (referring to FIG. 5) may be provided. Thereby, anisotropy in the in-plane direction is provided to the first magnetic layer 11. Thereby, the first magnetization 11M of the first magnetic layer 11 is substantially fixed in one direction (a direction crossing the Z-axis direction) in the plane. The first magnetic layer 11 is, for example, an in-plane magnetization film.

For example, it is favorable for a saturation magnetization Ms of the first magnetic layer 11 to be small. Thereby, the nonuniform application of the leakage magnetic field of the first magnetic layer 11 to the second magnetic layer 12 can be suppressed.

For example, the thickness of the first magnetic layer 11 (the reference layer) is thicker than the thickness of the second magnetic layer 12 (the free layer). Thereby, the first magnetization 11M of the first magnetic layer 11 is fixed stably in a prescribed direction.

When the first magnetic layer 11 is thick, there are cases where the magnetic field distribution generated from the first magnetic layer 11 becomes large; and the leakage magnetic field (the leakage magnetic field) from the first magnetic layer 11 is applied nonuniformly to the second magnetic layer 12. For example, the leakage magnetic field from the first magnetic layer 11 acts to cause the orientation of the second magnetization 12M to be parallel to the orientation of the first magnetization 11M. The leakage magnetic field from the first magnetic layer 11 changes the magnetization reversal magnetic field of the second magnetic layer 12 and causes the thermal agitation resistance of the first magnetic layer 11 to degrade. For example, the reversal symmetry of the second magnetic layer 12 becomes asymmetric due to the effects of the leakage magnetic field from the first magnetic layer 11. Thereby, for example, there are cases where the thermal stability is different between the state in which the first magnetization 11M and the second magnetization 12M are parallel and the state in which the first magnetization 11M and the second magnetization 12M are antiparallel. There is a possibility that the operations of the stacked body SB may become unstable.

By the saturation magnetization Ms of the first magnetic layer 11 being small, the instability of the operations caused by the leakage magnetic field of the first magnetic layer 11 can be suppressed.

In the embodiment, the first magnetic layer 11 may be a perpendicular magnetization film. In such a case, the first magnetic layer 11 includes, for example, a rare-earth metal-transition metal magnetic layer. The first magnetic layer includes, for example, a ferrimagnetic layer. For the rare-earth metal-transition metal magnetic layer, the saturation magnetization Ms is small; and the anisotropic magnetic field is large. For example, the first magnetic layer 11 includes TbCoFe (terbium-cobalt-iron). The first magnetic layer 11 may include an artificial lattice. The artificial lattice includes, for example, a stacked film including a Co film and a Pt film. The first magnetic layer 11 may include a crystal film including Fe and Pt. For example, the crystal film has an $L1_0$ structure.

In the embodiment, for example, the first magnetic layer 11 has a first coercivity and a first thickness along the first direction (the Z-axis direction). In such a case, for example, the second magnetic layer 12 may have at least one of a second thickness along the first direction that is thinner than the first thickness, or a second coercivity that is smaller than the first coercivity. For example, compared to the second magnetization 12M of the second magnetic layer 12, the first magnetization 11M of the first magnetic layer 11 is relatively difficult to change.

For example, in the embodiment, the electrical resistance between the first magnetic layer 11 and the second magnetic layer 12 is low in a first magnetization state in which the first magnetization 11M and the second magnetization 12M are "parallel" to each other. In a second magnetization state in which the first magnetization 11M and the second magnetization 12M are "antiparallel" to each other, the electrical resistance between the first magnetic layer 11 and the second magnetic layer 12 is higher than the electrical resistance in the first magnetization state. The first magnetization 11M and the second magnetization 12M may not be strictly "parallel" or "antiparallel" to each other. Different electrical resistances are obtained according to the relative changes of the orientations of these magnetizations. The states of the orientations of the magnetizations are stored when the power supply is OFF. The magnetic memory device according to the embodiment is, for example, nonvolatile memory.

According to the embodiment, for example, the fluctuation of the coercivity is suppressed. A MTJ element having retention durability can be provided.

Figure 6:
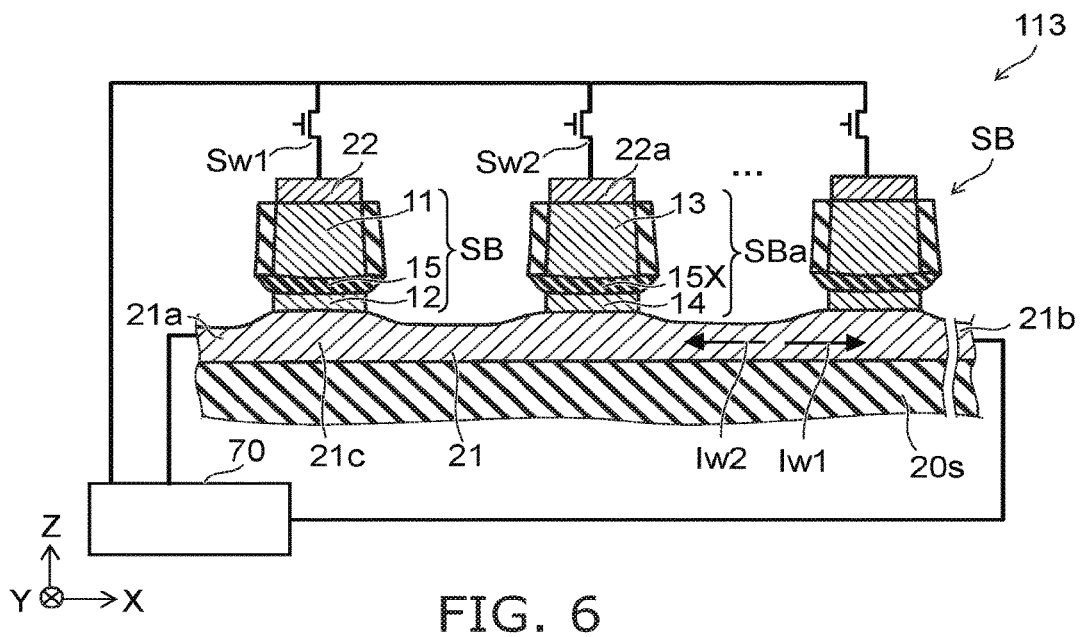
FIG. 6 is a schematic cross-sectional view illustrating another magnetic memory device according to the first embodiment.

FIG. 6 is a schematic cross-sectional view illustrating another magnetic memory device according to the first embodiment.

As shown in FIG. 6, the other magnetic memory device 113 according to the embodiment also includes the metal-containing layer 21, the first magnetic layer 11, the second magnetic layer 12, and the first intermediate layer 15. The first magnetic layer 11, the second magnetic layer 12, and the first intermediate layer 15 are included in the stacked body SB. The stacked body SB is similar to that of the magnetic memory device 110. The magnetic memory device 113 further includes a third magnetic layer 13, a fourth magnetic layer 14, and a second intermediate layer 15X.

The direction from the first magnetic layer 11 toward the third magnetic layer 13 is aligned with the second direction (e.g., the X-axis direction). The fourth magnetic layer 14 is provided between the third magnetic layer 13 and another portion of the metal-containing layer 21. The second intermediate layer 15X is provided between the third magnetic layer 13 and the fourth magnetic layer 14. The configurations and materials described in reference to the first magnetic layer 11, the second magnetic layer 12, and the first intermediate layer 15 are applicable to the third magnetic layer 13, the fourth magnetic layer 14, and the second intermediate layer 15X.

The third magnetic layer 13, the fourth magnetic layer 14, and the second intermediate layer 15X are included in a stacked body SBa. Thus, the multiple stacked bodies SB may be provided.

The multiple stacked bodies SB respectively correspond to multiple memory cells. It is possible to store mutually-different information in the multiple memory cells.

When storing the information in the multiple memory cells, for example, one of "1" or "0" may be stored in the multiple memory cells; and subsequently, the other of "1" or "0" may be stored in some of the multiple memory cells as desired. Or, for example, one of "1" or "0" may be stored in one of the multiple memory cells; and subsequently, the other of "1" or "0" may be stored in another one of the multiple memory cells.

In the example, the electrode 22 that is electrically connected to the first magnetic layer 11 is provided. An electrode 22a that is electrically connected to the third magnetic layer 13 is provided. A first switch Sw1 is provided between the electrode 22 and the controller 70. A second switch Sw2 is provided between the electrode 22a and the controller 70. The stacked body SB and the stacked body SBa are selected by operations of these switches.

For example, in the case where the stacked body SB is selected, the select potential is applied to the first magnetic layer 11; and the unselect potential is applied to the third magnetic layer 13. For example, in the case where the stacked body SBa is selected, the unselect potential is applied to the first magnetic layer 11; and the select potential is applied to the third magnetic layer 13. The select potential is different from the unselect potential.

Thus, in the magnetic memory device 113, the controller 70 is electrically connected to the first magnetic layer 11 and the third magnetic layer 13. In the first and second write operations, the controller 70 sets the potential of the first magnetic layer 11 to a potential that is different from the potential of the third magnetic layer. For example, one of these potentials is the select potential; and the other is the unselect potential. The application of a voltage of 0 volts also is included in "a voltage being applied." The potential of the select voltage is different from the potential of the unselect voltage.

Second Embodiment

Figure 7:
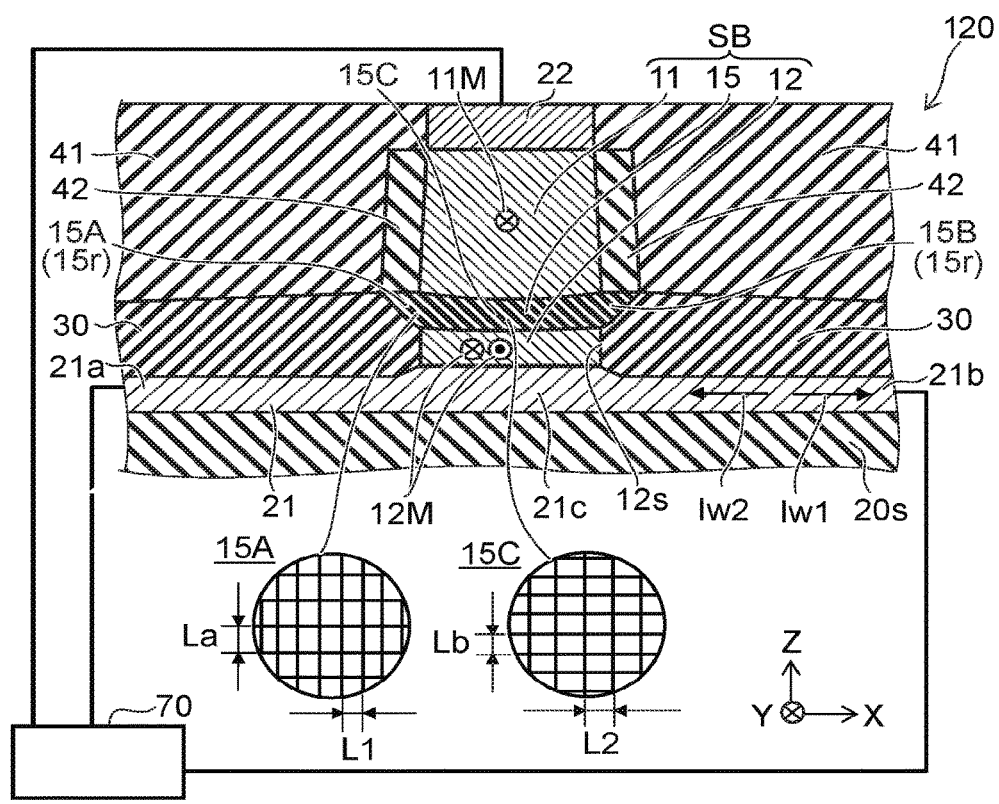
FIG. 7 is a schematic cross-sectional view illustrating a magnetic memory device according to a second embodiment.

FIG. 7 is a schematic cross-sectional view illustrating a magnetic memory device according to a second embodiment.

As shown in FIG. 7, the magnetic memory device 120 according to the second embodiment also includes the metal-containing layer 21, the first magnetic layer 11, the second magnetic layer 12, and the first intermediate layer 15. The first magnetic layer 11, the second magnetic layer 12, and the first intermediate layer 15 are included in the stacked body SB.

In such a case as well, the metal-containing layer 21 includes a metallic element. The second magnetic layer 12 is provided between the first magnetic layer 11 and the portion 21c of the metal-containing layer 21. The first intermediate layer 15 includes a portion provided between the first magnetic layer 11 and the second magnetic layer 12.

The first intermediate layer 15 includes a first region 15A, a second region 15B, and a third region 15C. The second region 15B is arranged with the first region 15A in the second direction (e.g., the X-axis direction) crossing the first direction (e.g., the Z-axis direction) from the second magnetic layer 12 toward the first magnetic layer 11. The third region 15C is provided between the first region 15A and the second region 15B. In the example, the first region 15A and the second region 15B are provided at the outer edge portion 15r (referring to FIG. 1C). For example, the first region 15A may correspond to the first end portion 15a. The second region 15B may correspond to the second end portion 15b. The first intermediate layer 15 is crystalline.

In the embodiment, the first lattice length L1 of the first region 15A is different from the second lattice length L2 of the third region 15C. The first lattice length L1 is the lattice length along one direction of the first region 15A. The second lattice length L2 is the lattice length of the second region 15B along the one direction recited above.

For example, the direction from the second magnetic layer 12 toward the first magnetic layer 11 is taken as the first direction (e.g., the Z-axis direction). One direction crossing the first direction is taken as the second direction (e.g., the X-axis direction).

For example, the first lattice length L1 is the lattice length along the second direction of the first region 15A. In such a case, the second lattice length L2 is the lattice length along the second direction of the second region 15B. The first lattice length L1 may be a lattice length La along the first direction of the first region 15A (referring to FIG. 7). In such a case, the second lattice length L2 is a lattice length Lb along the first direction of the second region 15B (referring to FIG. 7).

For example, the first lattice length L1 at the end of the first intermediate layer 15 is smaller than the second lattice length L2 at the central portion of the first intermediate layer 15.

For example, the ratio of the absolute value of the difference between the first lattice length L1 and the second lattice length L2 to the first lattice length L1 is 1% or more. For example, there are cases where the crystallinity of the first intermediate layer 15 decreases when a strain that is greater than 5% is applied. In such a case, the crystal is damaged; and, for example, the state may become amorphous. In such a case, the outer edge portion 15r is observed as being amorphous.

For example, the Young's modulus of the second magnetic layer 12 is about 200 GPa. When the difference of the lattice length of the first intermediate layer 15 is about 1%, the stress that is applied to the second magnetic layer 12 is about 2 GPa. The thermal agitation index based on the stress is estimated to be about 40 $k_B T$ in the case where the second magnetic layer 12 includes CoFeB, the magnetostriction constant is 15 ppm, and the size (e.g., the length in the X-axis direction) of the second magnetic layer 12 is 20 nm. For example, the thermal agitation index is about the same as the memory retention energy.

Accordingly, for example, the memory retention energy is ensured by the stress even in the case where the second magnetic layer 12 has a SAF structure. Therefore, the appropriate operations can be performed even in the case where the second magnetic layer 12 has the SAF structure. By the SAF structure, for example, the leakage magnetic field can be reduced; and the fluctuation of the coercivity can be reduced. Thereby, the pitch of the multiple memory cells (the stacked bodies SB) can be set to be small. A magnetic memory device can be provided in which the bit density can be increased.

In the embodiment, the lattice length of the first intermediate layer 15 is different between positions in the interior of the first intermediate layer 15. Thereby, for example, the controllability of the second magnetization 12M of the second magnetic layer 12 (e.g., the free layer) increases. Thereby, for example, the write error rate WER can be low. Thereby, for example, the effects from the adjacent memory cells do not occur easily. According to the embodiment, a magnetic memory device can be provided in which the bit density can be increased.

The description relating to the first embodiment is applicable appropriately to the second embodiment. For example, in the magnetic memory device 120, the controller 70 may implement the operations described in reference to the first embodiment. The description relating to the first embodiment is applicable to the metal-containing layer 21, the first magnetic layer 11, the second magnetic layer 12, the first intermediate layer 15, the base layer 20s, the electrode 22, the first insulating layer 41, and the second insulating layer 42.

For example, the metal-containing layer 21 includes the first portion 21a and the second portion 21b. The second portion 21b is arranged with the first portion 21a in the second direction (e.g., a direction crossing the first direction from the second magnetic layer 12 toward the first magnetic layer 11, e.g., the X-axis direction). The portion 21c of the metal-containing layer 21 is positioned between the first portion 21a and the second portion 21b. The controller 70 is electrically connected to the first portion 21a, the second portion 21b, and the first magnetic layer 11. For example, in the first write operation, the controller 70 supplies, to the metal-containing layer 21, the first write current Iw1 from the first portion 21a toward the second portion 21b. Thereby, the first state is formed. In the second write operation, the controller 70 supplies, to the metal-containing layer 21, the second write current Iw2 from the second portion 21b toward the first portion 21a. Thereby, the second state is formed. In the read operation, the controller 70 may sense the change of the characteristics (the voltage, the current, etc.) based on the electrical resistance between the first magnetic layer 11 and the first portion 21a. The first electrical resistance between the first magnetic layer 11 and the first portion 21a after the first write operation (the first state) is different from the second electrical resistance between the first magnetic layer 11 and the first portion 21a after the second write operation (the second state).

For example, the thickness (the thickness along the first direction, e.g., the Z-axis direction) of the first magnetic layer 11 is thicker than the thickness (the thickness along the first direction, e.g., the Z-axis direction) of the second magnetic layer 12. The first magnetization 11M of the first magnetic layer 11 is substantially fixed. The second magnetization 12M of the second magnetic layer 12 is changeable. The second magnetization 12M of the second magnetic layer 12 is aligned with the third direction (the Y-axis direction, e.g., a direction crossing the first direction and the second direction).

In the magnetic memory device 120 as well, the second magnetic layer 12 may include the first magnetic film 12A, the second magnetic film 12B, and the first intermediate film 12C (referring to FIG. 4). The second magnetic film 12B is antiferromagnetically coupled to the first magnetic film 12A.

In the magnetic memory device 120 as well, for example, the metal-containing layer 21 includes at least one selected from the group consisting of tantalum and tungsten. For example, the metal-containing layer 21 may include at least one selected from the group consisting of β-tantalum and β-tungsten. The metal-containing layer 21 may include at least one selected from the group consisting of platinum and gold. For example, the metal-containing layer 21 provides spin-orbit interaction torque to the second magnetic layer 12. For example, the metal-containing layer 21 contacts the second magnetic layer 12.

Examples of the characteristics of the magnetic memory device 120 will now be described.

Figure 8:
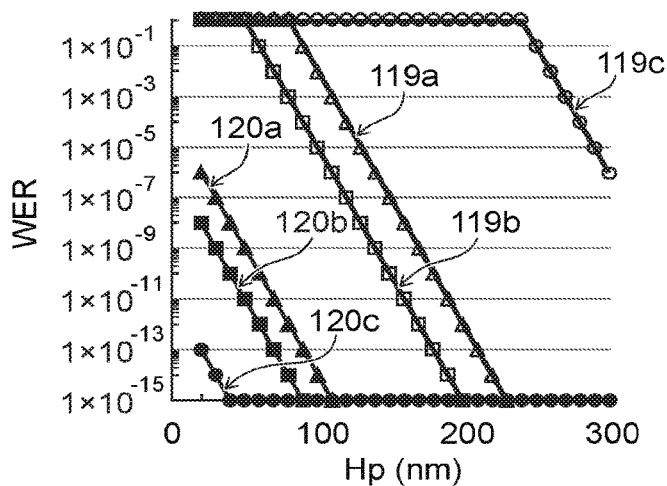
FIG. 8 is a graph illustrating the characteristics of the magnetic memory devices.

FIG. 8 is a graph illustrating the characteristics of the magnetic memory devices.

The horizontal axis of FIG. 8 is ½ of the pitch of the multiple memory cells (the half pitch (Hp)) when the multiple memory cells (the stacked bodies SB) are provided. The vertical axis is the write error rate WER.

FIG. 8 shows the simulation results of the characteristics of the following six types of magnetic memory devices. In the magnetic memory devices 120a, 120b, and 120c, the ratio of the absolute value of the difference between the first lattice length L1 and the second lattice length L2 to the first lattice length L1 is 1% for the first intermediate layer 15. In the magnetic memory devices 119a, 119b, and 119c, the first lattice length L1 is the same as the second lattice length L2 for the first intermediate layer 15. In other words, the ratio is 0%. In the magnetic memory devices 120a and 119a, the second magnetic layer 12 is a single layer. In the magnetic memory devices 120b and 119b, the second magnetic layer 12 has a ferromagnetically-coupled synthetic structure. In the magnetic memory devices 120c and 119c, the second magnetic layer 12 has an antiferromagnetically-coupled synthetic structure. In the simulation, the thickness (the length in the Z-axis direction) of the second magnetic layer 12 is 2 nm. The length in the Y-axis direction is 20 nm. The length in the X-axis direction is 60 nm. The aspect ratio is 3.

It can be seen from FIG. 8 that compared to the magnetic memory devices 119a, 119b, and 119c, a low write error rate WER is obtained in the magnetic memory devices 120a, 120b, and 120c. The write error rate WER degrades as the half pitch Hp decreases. It is considered that this is because the effects of the proximal elements become large when the pitch becomes small. For example, by changing the lattice length of the first intermediate layer 15 (e.g., 1% of the lattice length or more), a low write error rate WER can be maintained even when the pitch is set to be small.

In a practical memory device, the write error rate WER is, for example, not more than $10^{-10}$. For example, in the antiferromagnetically-coupled synthetic structure (the magnetic memory device 120c), a sufficiently practical write error rate WER is obtained when the half pitch Hp is 50 nm or less.

FIG. 9A to FIG. 9D are schematic cross-sectional views illustrating other magnetic memory devices according to the second embodiment.

Figure 9A:
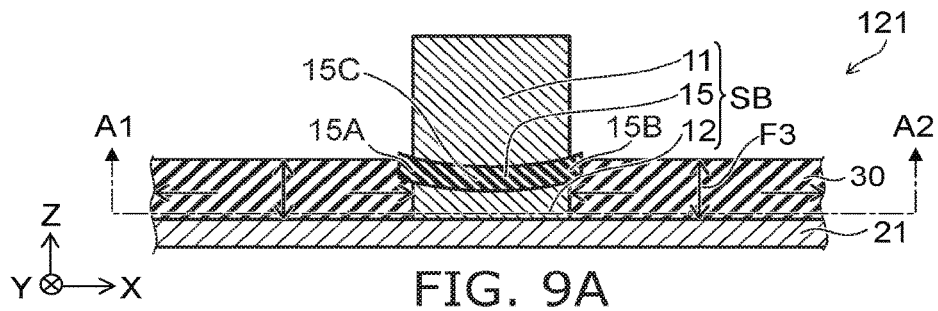
FIG. 9A to FIG. 9D are schematic cross-sectional views illustrating other magnetic memory devices according to the second embodiment.
Figures 9B, 9C, 9D:
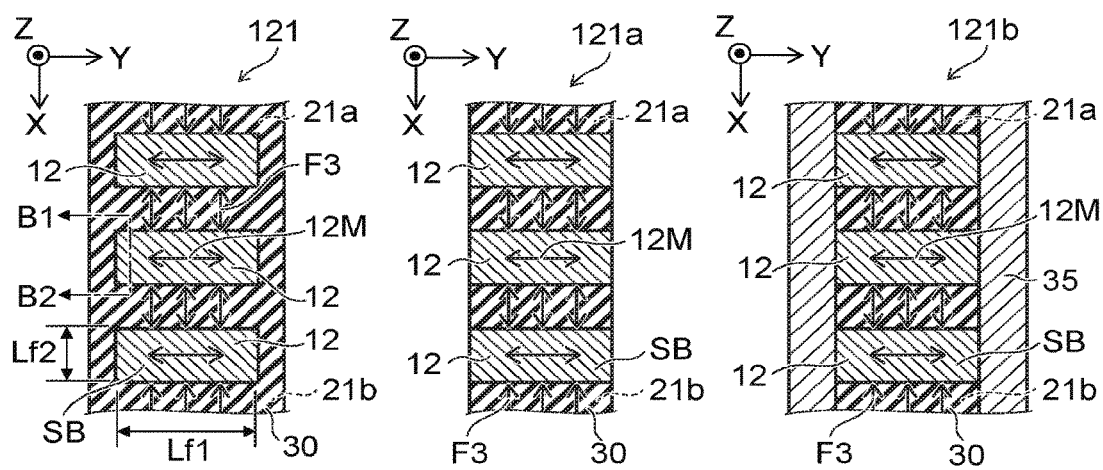

FIG. 9A is a line B1-B2 cross-sectional view of FIG. 9B. FIG. 9B is a line A1-A2 cross-sectional view of FIG. 9A. FIG. 9C and FIG. 9D are cross-sectional views corresponding to line A1-A2 for other magnetic memory devices.

As shown in FIG. 9A, the metal-containing layer 21 and the stacked body SB are provided in the magnetic memory device 121 as well. The stacked body SB includes the first magnetic layer 11, the second magnetic layer 12, and the first intermediate layer 15. The base layer 20s, the electrode 22, the first insulating layer 41, the second insulating layer 42, and the controller 70 are not illustrated in FIG. 9A.

In a magnetic memory device 121 as well, the first lattice length L1 of the first region 15A is different from the second lattice length L2 of the third region 15C. For example, such a difference of lattice lengths occurs due to stress F3 from the compound layer 30. In the magnetic memory device 121 as well, the bit density can be increased.

For example, the compound layer 30 covers the side surface of the second magnetic layer 12. The compound layer includes, for example, an oxide or a nitride of the metal-containing layer 21. For example, plasma processing (at least one of oxygen plasma or nitrogen plasma processing) of the metal film 21fm used to form the metal-containing layer 21 is performed (referring to FIG. 1B). A compound that includes at least one of an oxide or a nitride is formed on the surface of the metal film 21fm. Thereby, the compound layer 30 is formed. Volume expansion occurs at this time. The compound layer 30 is formed on the side surface (the side wall) of the second magnetic layer 12 by the volume expansion of the compound. A compressive stress is applied to the second magnetic layer 12.

For example, thermal oxidation or thermal nitridation of the metal film 21fm may be performed. For example, the thermal expansion coefficient of the compound (the oxide or the nitride) of the metal film 21fm is, for example, not more than about 1/10 of the thermal expansion coefficient of the metal film 21fm (the metal-containing layer 21). The thermal expansion coefficient of the compound (the oxide or the nitride) of the metal film 21fm is, for example, not more than about 1/10 of the thermal expansion coefficient of the second magnetic layer 12. Therefore, the stress F3 (e.g., the compressive stress) is generated in the compound of the metal film 21fm when the temperature decreases from the high-temperature state. Thereby, it is considered that the difference occurs between the lattice lengths of the first intermediate layer 15. Then, the stress F3 is applied to the second magnetic layer 12. Thereby, it is considered that the second magnetization 12M of the second magnetic layer 12 is easily maintained in the desired state.

As shown in FIG. 9B, the multiple second magnetic layers 12 (the stacked bodies SB) are provided in the other magnetic memory device 121 according to the embodiment. The multiple second magnetic layers 12 (the multiple stacked bodies SB) are arranged along the X-axis direction (the second direction). In the example, shape anisotropy is provided in the second magnetic layer 12 (the stacked body SB).

For example, the second magnetic layer 12 has a first length Lf1 and a second length Lf2. The second length Lf2 is the length of the second magnetic layer 12 along the second direction (e.g., the X-axis direction). The first length Lf1 is the length of the second magnetic layer 12 along the third direction (e.g., the Y-axis direction). The third direction crosses the first direction (the Z-axis direction). The third direction is perpendicular to the second direction (the X-axis direction). The first length Lf1 is longer than the second length Lf2. For example, the first length Lf1 is not less than 1.5 times and not more than 10 times the second length Lf2.

The shape anisotropy is provided in the second magnetic layer 12 (the stacked body SB) by setting the first length Lf1 to be different from the second length Lf2. The magnetization of the magnetic layer is aligned with the desired direction by the shape anisotropy.

In the magnetic memory device 121, it is considered that the stress F3 applied to the side wall of the second magnetic layer 12 along the Y-axis direction is larger than that applied to the side wall of the second magnetic layer 12 along the X-axis direction. Thereby, the second magnetization 12M of the second magnetic layer 12 is easily aligned with the Y-axis direction. Uniaxiality is provided in the second magnetic layer 12. For example, the second magnetization 12M of the second magnetic layer 12 is aligned with the third direction (e.g., the Y-axis direction) crossing the first direction (the Z-axis direction) and the second direction (the Y-axis direction).

In a magnetic memory device 121a as shown in FIG. 9C, the compound layer 30 opposes the second magnetic layer 12 in the X-axis direction. The compound layer 30 overlaps the second magnetic layer 12 in the X-axis direction. On the other hand, the compound layer 30 does not overlap the second magnetic layer 12 in the Y-axis direction. In the example, the stress F3 that is applied to the second magnetic layer 12 is much different by direction. Thereby, uniaxiality is provided to the second magnetic layer 12.

As shown in FIG. 9D, a sidewall layer 35 is further provided in a magnetic memory device 121b. The sidewall layer 35 overlaps the second magnetic layer 12 in the Y-axis direction. The material of the sidewall layer 35 is different from the material of the compound layer 30. The compound layer 30 includes, for example, at least one selected from the group consisting of silicon oxide, tantalum oxide, titanium oxide, hafnium oxide, silicon nitride, tantalum nitride, titanium nitride, hafnium nitride, silicon oxynitride, tantalum oxynitride, titanium oxynitride, and hafnium oxynitride. On the other hand, the compound layer 30 overlaps the second magnetic layer 12 in the X-axis direction. For example, the sidewall layer 35 includes silicon oxide when the compound layer 30 includes titanium oxide.

By providing the compound layer 30 and the sidewall layer 35, for example, the stress that is applied to the second magnetic layer 12 is different by direction. Thereby, uniaxiality is provided in the second magnetic layer 12. For example, the sidewall layer 35 applies tensile stress to, for example, the second magnetic layer 12.

Thus, the compound layer 30 and the sidewall layer 35 apply the stress to the second magnetic layer 12. For example, the compound layer 30 and the sidewall layer 35 may improve the insulative properties at the side surface of the stacked body SB.

For example, in the patterning when forming the stacked body SB, there are cases where conductive adhered matter forms on the side wall of the stacked body SB. For example, there are cases where sufficient insulative properties are not obtained at the side wall. By the compound layer 30 causing the first intermediate layer 15 to curve toward the upward direction (referring to FIG. 1C), the electrical insulative properties at the side wall of the stacked body SB can be improved. Thereby, the change of the electrical resistance based on the TMR can be obtained effectively.

In the magnetic memory devices 121, 121a, and 121b as well, for example, a difference occurs between the lattice lengths of the first intermediate layer 15.

Figure 10:
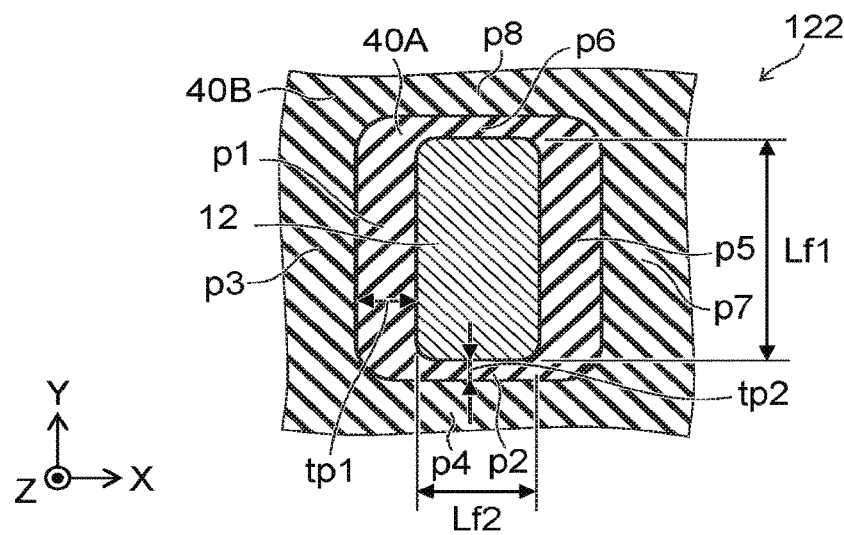
FIG. 10 is a schematic cross-sectional view illustrating another magnetic memory device according to the second embodiment.

FIG. 10 is a schematic cross-sectional view illustrating another magnetic memory device according to the second embodiment.

FIG. 10 is a cross-sectional view corresponding to a line A1-A2 cross section of FIG. 9A.

Similarly to the magnetic memory device 121, the magnetic memory device 122 shown in FIG. 10 also includes the metal-containing layer 21 and the stacked body SB. The base layer 20s, the electrode 22, the first insulating layer 41, the second insulating layer 42, and the controller 70 also may be provided. These components are not illustrated in FIG. 10. A first insulating portion 40A and a second insulating portion 40B are provided in the magnetic memory device 122. Otherwise, for example, the magnetic memory device 122 is similar to the magnetic memory device 120. These insulating portions will now be described.

The first insulating portion 40A includes a first partial region p1 and a second partial region p2. In the example, the first insulating portion 40A further includes a fifth partial region p5 and a sixth partial region p6. These partial regions may be continuous or discontinuous.

The second magnetic layer 12 is provided between the first partial region p1 and the fifth partial region p5 in the second direction (e.g., the X-axis direction). The second magnetic layer 12 is provided between the second partial region p2 and the sixth partial region p6 in the third direction (e.g., the Y-axis direction). The third direction crosses the first direction (the Z-axis direction) and is perpendicular to the second direction.

The second insulating portion 40B includes a third partial region p3 and a fourth partial region p4. In the example, the second insulating portion 40B further includes a seventh partial region p7 and an eighth partial region p8. These partial regions may be continuous or discontinuous.

The first partial region p1 is provided between the second magnetic layer 12 and the third partial region p3 in the second direction (the X-axis direction). The second partial region p2 is provided between the second magnetic layer 12 and the fourth partial region p4 in the third direction (the Y-axis direction). The fifth partial region p5 is provided between the second magnetic layer 12 and the seventh partial region p7 in the second direction (the X-axis direction). The sixth partial region p6 is provided between the second magnetic layer 12 and the eighth partial region p8 in the third direction (the Y-axis direction).

The thickness (the length aligned with the X-Y plane) of the first insulating portion 40A is different by direction. For example, the first partial region p1 has a first partial region thickness tp1 along the second direction. The second partial region p2 has a second partial region thickness tp2 along the third direction. The second partial region thickness tp2 is different from the first partial region thickness tp1. In the example, the first partial region thickness tp1 is thicker than the second partial region thickness tp2. Thereby, the stress that is applied to the second magnetic layer 12 is different between the X-axis direction and the Y-axis direction.

For example, the stress along the Y-axis direction is smaller than the stress along the X-axis direction. Anisotropic stress is applied to the second magnetic layer 12. The direction of the second magnetization 12M of the second magnetic layer 12 can be stabilized easily in the desired direction. In the magnetic memory device 122 as well, for example, a difference occurs between the lattice lengths of the first intermediate layer 15. In the magnetic memory device 122 as well, the bit density can be increased.

In the magnetic memory device 122, the fifth partial region p5 has a thickness (e.g., similar to the first partial region thickness tp1) along the second direction. The sixth partial region p6 has a thickness (e.g., similar to the second partial region thickness tp2) along the third direction. These thicknesses are different from each other.

FIG. 11A and FIG. 11B are schematic cross-sectional views illustrating a method for manufacturing another magnetic memory device according to the second embodiment.

As shown in FIG. 11A, the stacked body SB is formed by forming a stacked film used to form the stacked body SB on the metal film 21fm (referring to FIG. 1B) and by patterning the stacked film. For example, the patterning is performed by ion beam etching. The ion beam etching stops at the upper surface of the metal film 21fm. The second magnetic layer 12 is illustrated in FIG. 11A. Subsequently, a film 40Af that is used to form the first insulating portion 40A is formed. The film 40Af is, for example, a SiN film.

As shown in FIG. 11B, an ion beam IB is irradiated along the Y-axis direction. Thereby, a portion of the film 40Af is removed. Thereby, the thickness of a portion (the portion opposing the second magnetic layer 12 in the Y-axis direction) of the film 40Af is locally thin. Thereby, the first insulating portion 40A is formed.

Figure 12:
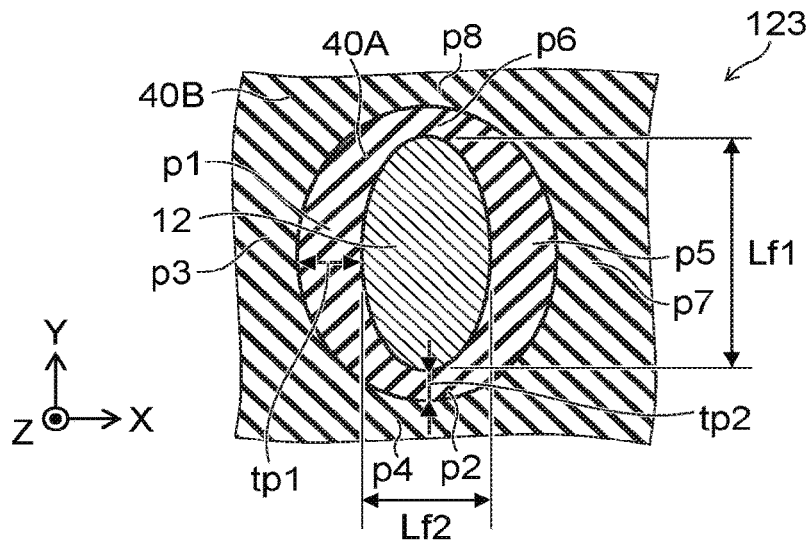
FIG. 12 is a schematic cross-sectional view illustrating another magnetic memory device according to the second embodiment.

FIG. 12 is a schematic cross-sectional view illustrating another magnetic memory device according to the second embodiment.

In the magnetic memory device 123 as shown in FIG. 12, the planar configuration (the planar configuration aligned with the X-Y plane) of the second magnetic layer 12 (the stacked body SB) is a flattened circular configuration (including ellipses). Otherwise, the magnetic memory device 123 is similar to the magnetic memory device 122. In the magnetic memory device 123 as well, the first partial region thickness tp1 is thicker than the second partial region thickness tp2. The direction of the second magnetization 12M of the second magnetic layer 12 can be easily stabilized in the desired direction. In the magnetic memory device 123 as well, for example, a difference occurs between the lattice lengths of the first intermediate layer 15. In the magnetic memory device 123 as well, the bit density can be increased.

Figure 13A:
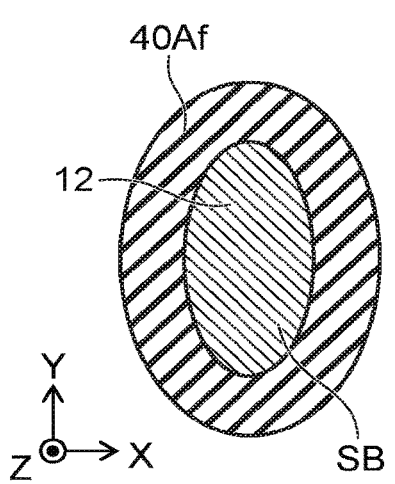
FIG. 13A and FIG. 13B are schematic cross-sectional views illustrating a method for manufacturing another magnetic memory device according to the second embodiment
Figure 13B:
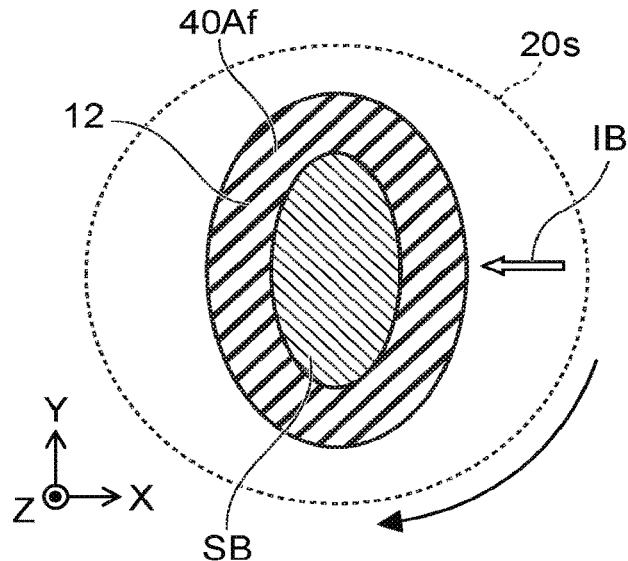

FIG. 13A and FIG. 13B are schematic cross-sectional views illustrating a method for manufacturing another magnetic memory device according to the second embodiment.

As shown in FIG. 13A, the stacked body SB is formed by forming a stacked film used to form the stacked body SB on the metal film 21fm (referring to FIG. 1B) and by patterning the stacked film. The planar configuration of the stacked body SB is a flattened circular configuration. The patterning stops at the upper surface of the metal film 21fm. Subsequently, the film 40Af that is used to form the first insulating portion 40A is formed. The film 40Af is, for example, a SiN film.

As shown in FIG. 13B, the ion beam IB is irradiated while rotating the substrate (the base layer 20s) using the Z-axis direction as the axis. Thereby, a portion of the film 40Af is removed. In such a case, the curvature of the portion of the film 40Af overlapping the second magnetic layer 12 in the Y-axis direction is higher than the curvature of the portion of the film 40Af overlapping the second magnetic layer 12 in the X-axis direction. Thereby, the removal rate of the film 40Af due to the irradiation of the ion beam IB is different between these portions. Thereby, the thickness of the portion of the film 40Af opposing the second magnetic layer 12 in the Y-axis direction is locally thin. Thereby, the first insulating portion 40A is formed.

The anisotropic irradiation of the ion beam IB described in reference to FIG. 11B may be performed to form the magnetic memory device 123.

Figure 14:
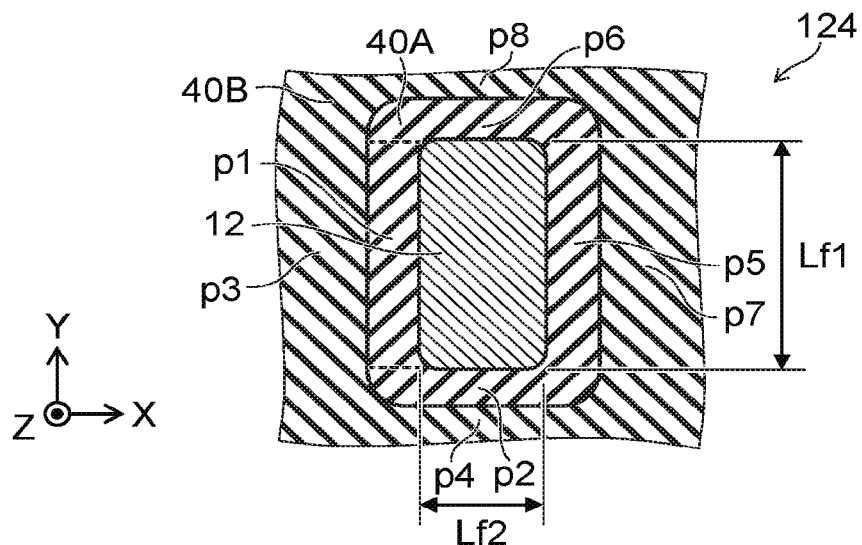
FIG. 14 is a schematic cross-sectional view illustrating another magnetic memory device according to the second embodiment.

FIG. 14 is a schematic cross-sectional view illustrating another magnetic memory device according to the second embodiment.

As shown in FIG. 14, the first insulating portion 40A and the second insulating portion 40B are provided in the magnetic memory device 124 as well. In the magnetic memory device 124, the material of the first insulating portion 40A is different by location. Otherwise, the magnetic memory device 124 is similar to the magnetic memory device 122; and a description is therefore omitted.

In the first insulating portion 40A, the material of the first partial region p1 is different from the material of the second partial region p2. Further, the material of the fifth partial region p5 may be different from the material of the sixth partial region p6. For example, the first partial region p1 and the fifth partial region p5 include silicon oxide. The second partial region p2 and the sixth partial region p6 include silicon nitride. Anisotropy occurs in the stress applied to the second magnetic layer 12 due to the different materials. Thereby, the direction of the second magnetization 12M of the second magnetic layer 12 can be easily stabilized in the desired direction. In the magnetic memory device 124 as well, for example, a difference occurs between the lattice lengths of the first intermediate layer 15. In the magnetic memory device 124 as well, the bit density can be increased.

In the magnetic memory device 124, the material of the second insulating portion 40B may be uniform. In the magnetic memory device 124, the thickness of the first insulating portion 40A may be different by location as in the magnetic memory device 122.

For example, the first partial region p1 has a first material and the first partial region thickness tp1 along the second direction (the X-axis direction). In such a case, the second partial region p2 may have at least one of the second partial region thickness tp2 along the third direction (the Y-axis direction) that is different from the first partial region thickness tp1, or a second material that is different from the first material.

Figure 15:
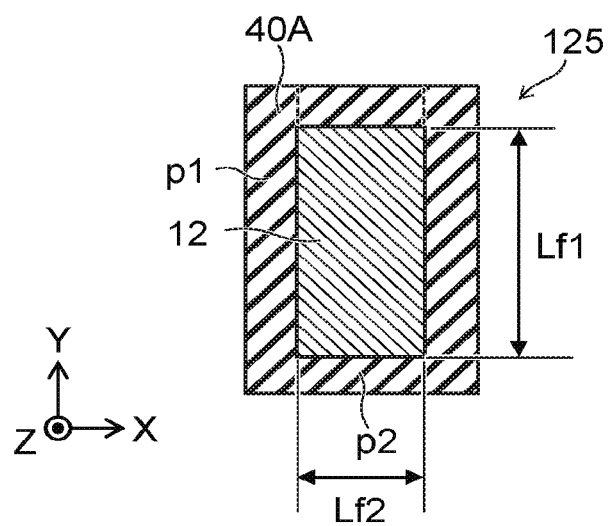
FIG. 15 is a schematic cross-sectional view illustrating another magnetic memory device according to the second embodiment.

FIG. 15 is a schematic cross-sectional view illustrating another magnetic memory device according to the second embodiment.

As shown in FIG. 15, the first insulating portion 40A is provided in the magnetic memory device 125 as well. In the magnetic memory device 125 as well, the material of the first insulating portion 40A is different by location. Otherwise, the magnetic memory device 125 is similar to the magnetic memory device 124; and a description is therefore omitted. The first insulating portion 40A of the magnetic memory device 125 will now be described.

The first insulating portion 40A includes the first partial region p1 and the second partial region p2. The first partial region p1 overlaps the second magnetic layer 12 in the second direction (e.g., the X-axis direction). The second partial region p2 overlaps the second magnetic layer 12 in the third direction (a direction crossing the first direction and being perpendicular to the second direction, e.g., the Y-axis direction). The material of the first partial region p1 is different from the material of the second partial region p2. For example, the first partial region p1 includes silicon oxide; and the second partial region p2 includes silicon nitride. The direction of the second magnetization 12M of the second magnetic layer 12 can be easily stabilized in the desired direction. In the magnetic memory device 125 as well, for example, a difference occurs between the lattice lengths of the first intermediate layer 15. In the magnetic memory device 125 as well, the bit density can be increased.

An example of a method for manufacturing the magnetic memory device 125 will now be described.

FIG. 16A to FIG. 16I are schematic views illustrating the method for manufacturing the other magnetic memory device according to the second embodiment.

FIG. 16A, FIG. 16C, FIG. 16E, FIG. 16G, and FIG. 16I are cross-sectional views. FIG. 16B, FIG. 16D, FIG. 16F, and FIG. 16H are plan views.

Figure 16A:
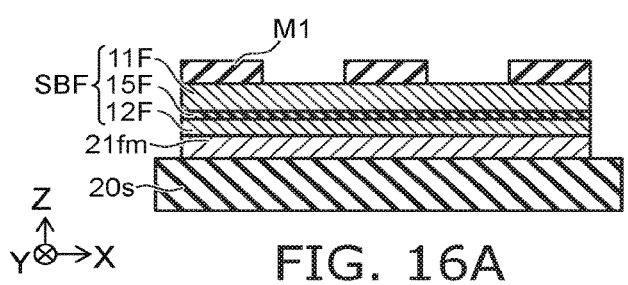
FIG. 16A to FIG. 16I are schematic views illustrating the method for manufacturing the other magnetic memory device according to the second embodiment.
Figure 16B:
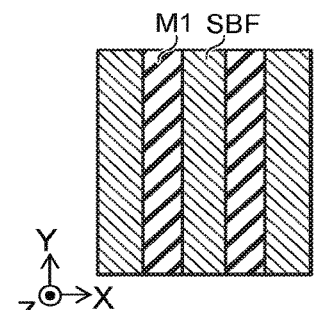

As shown in FIG. 16A and FIG. 16B, the metal film 21fm that is used to form the metal-containing layer 21 is provided on the substrate (the base layer 20s). A stacked film SBF that is used to form the stacked body SB is provided on the metal film 21fm. The stacked film SBF includes a film 12F that is used to form the second magnetic layer 12, a film 15F that is used to form the first intermediate layer 15, and a film 11F that is used to form the first magnetic layer 11. A mask M1 is provided on the stacked film SBF. In the example, the mask M1 has a band configuration along the Y-axis direction.

Figure 16C:
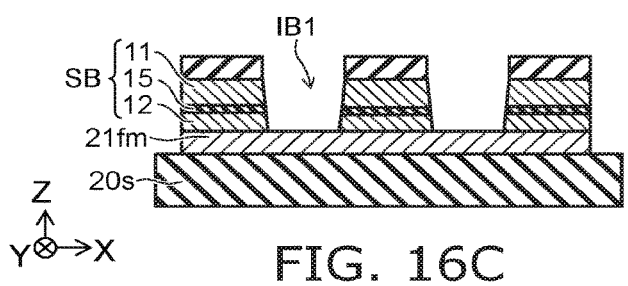
Figure 16D:
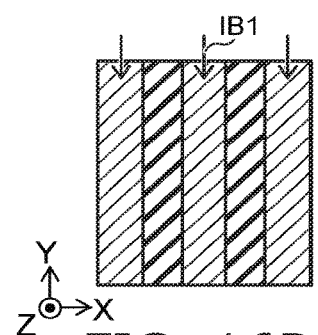

As shown in FIG. 16C and FIG. 16D, an ion beam IB1 is irradiated on the stacked film SBF exposed in the opening of the mask M1. Thereby, a portion of the stacked film SBF is removed. Thereby, the stacked body SB (the second magnetic layer 12, the first intermediate layer 15, and the first magnetic layer 11) is formed. The metal film 21fm is exposed in the opening of the mask M1.

Figure 16E:
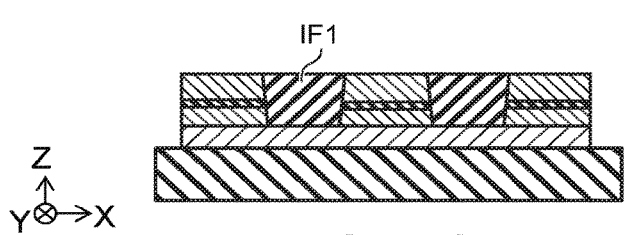
Figure 16F:
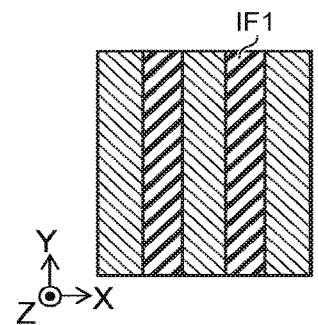

As shown in FIG. 16E and FIG. 16F, an insulating film IF1 is formed on the exposed metal film 21fm. The insulating film IF1 is, for example, silicon nitride. The upper surface is planarized.

Figure 16G:
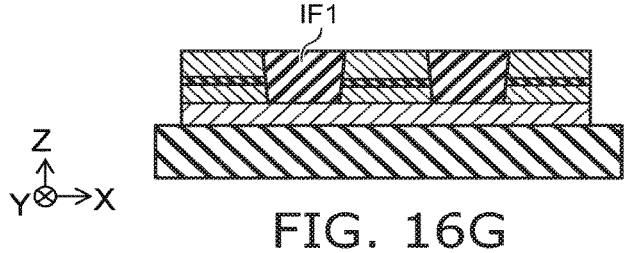
Figure 16H:
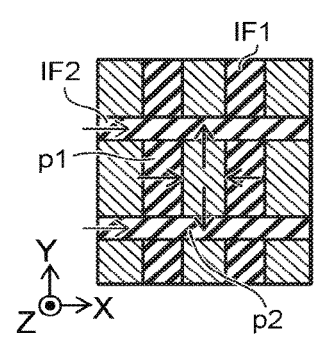
Figure 16I:
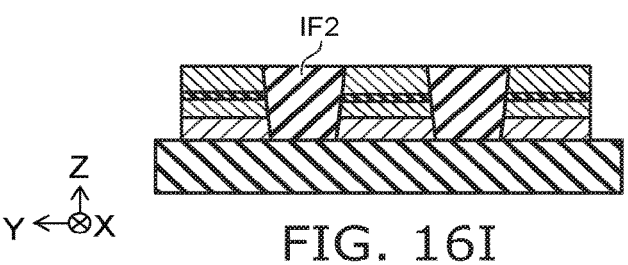

As shown in FIG. 16G to FIG. 16I, another mask (not illustrated) is formed; and the stacked film SBF and the insulating film IF1 that are exposed in the opening of the other mask are removed. The other mask has a band configuration extending along a direction (e.g., the X-axis direction) crossing the direction in which the mask M1 extends. An insulating film IF2 is formed in the removed portion and planarized. The material of the insulating film IF2 is different from the material of the insulating film IF1. For example, the insulating film IF2 includes silicon nitride in the case where the insulating film IF1 includes silicon oxide.

Thus, the magnetic memory device 125 is formed.

For example, the insulating film IF1 is formed using conditions such that one of compressive stress or tensile stress is obtained. For example, the insulating film IF2 is formed using conditions such that the other of compressive stress or tensile stress is obtained. Uniaxial stress is introduced to the second magnetic layer 12.

Another method for manufacturing the magnetic memory device 125 will now be described.

FIG. 17A to FIG. 17F are schematic cross-sectional views illustrating the method for manufacturing another magnetic memory device according to the second embodiment.

As shown in FIG. 17A, the stacked film SBF (the film 12F used to form the second magnetic layer 12, the film 15F used to form the first intermediate layer 15, and the film 11F used to form the first magnetic layer 11) that is used to form the stacked body SB is provided on the metal film 21fm provided on the substrate (the base layer 20s). The mask M1 is provided on the stacked film SBF. In the example, the mask M1 has a band configuration along the Y-axis direction.

As shown in FIG. 17B, a portion of the stacked film SBF exposed in the opening of the mask M1 is removed. For example, the removing is performed by RIE (Reactive Ion Etching), etc. The film 12F that is used to form the second magnetic layer 12 remains in the processing.

As shown in FIG. 17C, an ion beam IB2 is irradiated on the film 12F exposed in the opening of the mask M1. The ion beam IB2 is, for example, at least one of an oxygen ion beam or a nitrogen ion beam. Thereby, a compound film 12FC is formed from the film 12F.

As shown in FIG. 17D, the insulating film IF1 is formed on the compound film 12FC. The insulating film IF1 is, for example, silicon nitride. The upper surface is planarized.

Subsequently, for example, the processing described in reference to FIG. 16G to FIG. 16I is performed. Thereby, the magnetic memory device 125 is formed.

In the example, physical patterning of the film 12F used to form the second magnetic layer 12 is not performed. For example, the active gas of processing such as RIE, etc., substantially does not contact the side wall of the second magnetic layer 12. For example, thereby, the operations of the stacked body SB (the MTJ element) are stabilized. A high yield is obtained.

In the example as shown in FIG. 17E, in the processing described in reference to FIG. 17C recited above, a compound film 12fmc may be formed from the metal film 21fm by the irradiation of the ion beam IB2 in addition to the formation of the compound film 12FC. Volume expansion occurs in the compound film 12fmc.

Subsequently, as shown in FIG. 17F, the insulating film IF1 is formed on the compound film 12FC; and the upper surface is planarized. Subsequently, for example, the processing described in reference to FIG. 16G to FIG. 16I is performed. Thereby, the magnetic memory device 125 is formed. By forming the compound film 12fmc, for example, a larger stress can be applied to the second magnetic layer 12.

FIG. 18A to FIG. 18I are schematic views illustrating a method for manufacturing another magnetic memory device according to the second embodiment.

FIG. 18A, FIG. 18C, FIG. 18E, FIG. 18G, and FIG. 18I are cross-sectional views. FIG. 18B, FIG. 18D, FIG. 18F, and FIG. 18H are plan views.

Figure 18A:
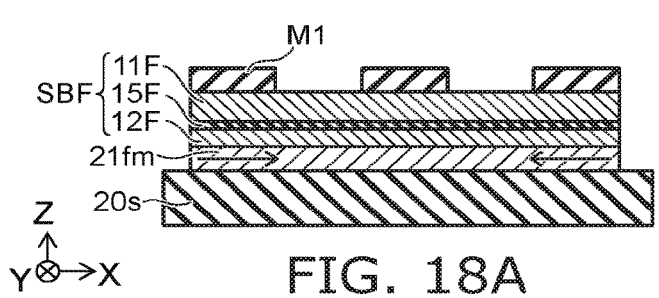
FIG. 18A to FIG. 18I are schematic views illustrating a method for manufacturing another magnetic memory device according to the second embodiment.
Figure 18B:
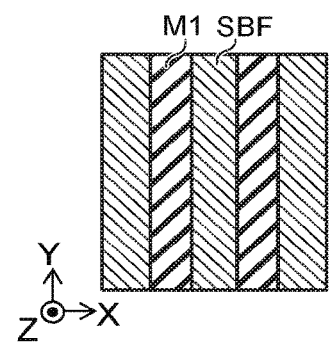

The metal film 21fm is formed on the substrate (the base layer 20s) as shown in FIG. 18A and FIG. 18B. The stacked film SBF that is used to form the stacked body SB is formed on the metal film 21fm. The stacked film SBF includes the film 12F that is used to form the second magnetic layer 12, the film 15F that is used to form the first intermediate layer 15, and the film 11F that is used to form the first magnetic layer 11.

In the example, the metal film 21fm is formed using conditions in which the stress (e.g., compressive stress) is applied. For example, the metal film 21fm is formed by sputtering in a low-pressure atmosphere. Thereby, for example, the Ar gas is not easily incorporated into the film. The metal film 21fm is formed in a dense state. Thereby, compressive stress is generated in the metal film 21fm. For example, the metal film 21fm is formed by sputtering using Kr gas. Thereby, for example, the gas inside the metal film 21fm is not easily incorporated. The metal film 21fm has a dense state. Thereby, compressive stress is generated in the metal film 21fm. For example, the lattice constant of the metal film 21fm can be changed 1% or more from the reference of the unstrained state.

For example, a Ta film is used as the metal film 21fm; and a CoFeB film is used as the film 12F used to form the second magnetic layer 12. After forming these films, for example, processing is performed at a high temperature (a temperature not less than about 230° C. and not more than 270° C.). Thereby, for example, the B (boron) inside the film 12F moves (e.g., diffuses) into the metal film 21fm; and compressive stress is generated in the metal film 21fm.

As shown in FIG. 18A and FIG. 18B, the mask M1 is provided on the stacked film SBF. The mask M1 has a band configuration along the Y-axis direction.

Figure 18C:
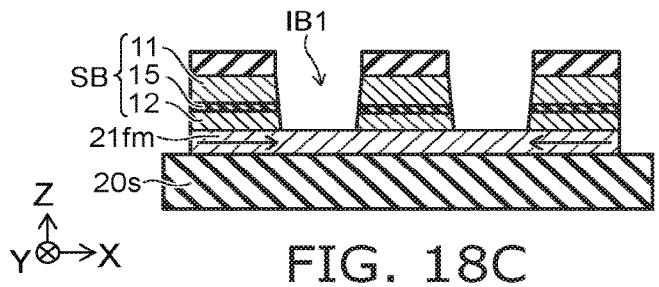
Figure 18D:
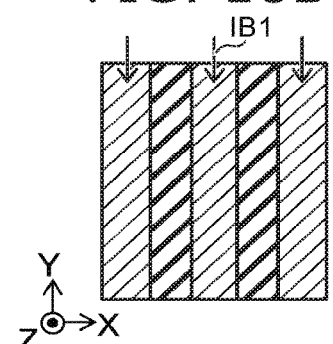

As shown in FIG. 18C and FIG. 18D, the ion beam IB1 is irradiated on the stacked film SBF exposed in the opening of the mask M1. Thereby, a portion of the stacked film SBF is removed. Thereby, the stacked body SB (the second magnetic layer 12, the first intermediate layer 15, and the first magnetic layer 11) is formed. The metal film 21fm is exposed in the opening of the mask M1.

As recited above, in the case where the compressive stress is provided in the metal film 21fm, the stress is released by the patterning of the stacked film SBF. Thereby, for example, tensile stress is generated in the second magnetic layer 12.

Figure 18E:
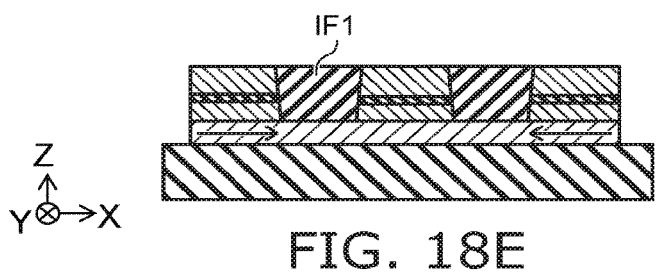
Figure 18F:
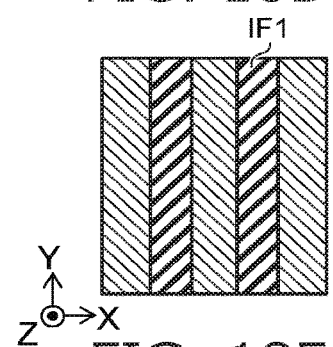

As shown in FIG. 18E and FIG. 18F, the insulating film IF1 is formed on the exposed metal film 21fm. The insulating film IF1 is, for example, silicon nitride. The upper surface is planarized.

Figure 18G:
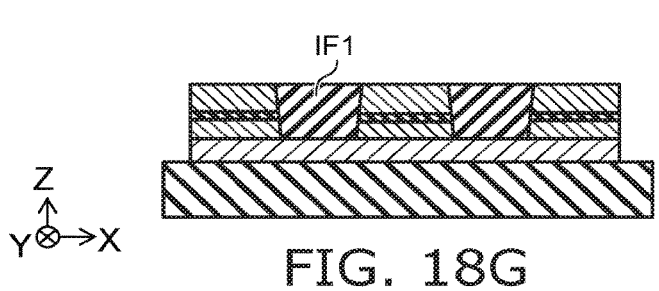
Figure 18H:
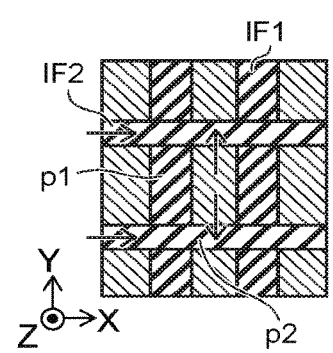
Figure 18I:
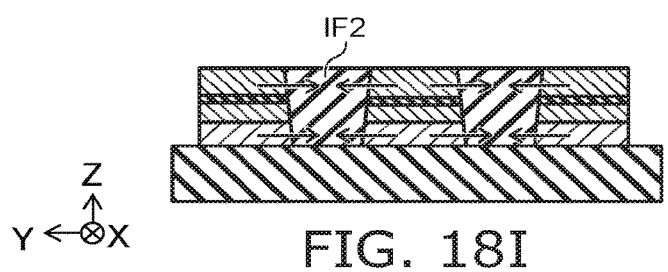

As shown in FIG. 18G to FIG. 18I, another mask (not illustrated) is formed; and the insulating film IF1 and the stacked film SBF exposed in the opening of the other mask are removed. The other mask has a band configuration extending along a direction (e.g., the X-axis direction) crossing the direction in which the mask M1 extends. The insulating film IF2 is formed in the removed portion and planarized. The material of the insulating film IF2 is different from the material of the insulating film IF1. For example, the insulating film IF2 includes silicon nitride in the case where the insulating film IF1 includes silicon oxide.

Thus, the magnetic memory device 125 is formed.

In the magnetic memory devices 120, 120a to 120c, 121, 121a, 121b, and 122 to 125, the first intermediate layer 15 may be convex toward the metal-containing layer 21. In the magnetic memory devices 120, 120a to 120c, 121, 121a, 121b, and 122 to 125, in the first direction (the direction from the second magnetic layer 12 toward the first magnetic layer 11), the first distance t1 (the shortest distance) between the second surface 11fb and the outer edge portion 15r may be shorter than the second distance t2 (the shortest distance) between the second surface 11fb and the inner portion 15c (referring to FIG. 1C).

Third Embodiment

Figure 19:
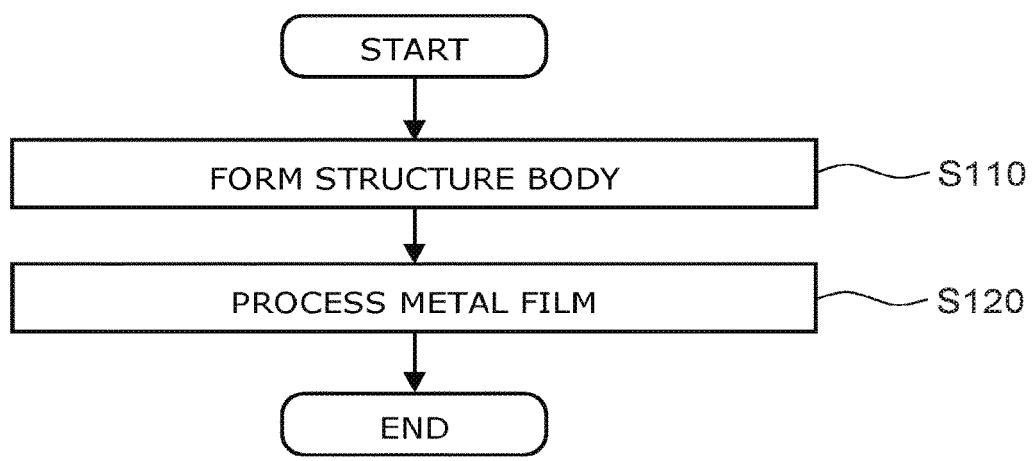
FIG. 19 is a flowchart illustrating a method for manufacturing a magnetic memory device according to a third embodiment.

FIG. 19 is a flowchart illustrating a method for manufacturing a magnetic memory device according to the third embodiment.

In the method for manufacturing the magnetic memory device according to the embodiment as shown in FIG. 19, the structure body SB0 (referring to FIG. 1B) is formed (step S110). The structure body SB0 includes the metal film 21fm, the second magnetic layer 12, the first intermediate layer 15, and the first magnetic layer 11. The second magnetic layer 12 is provided between the first magnetic layer 11 and a portion of the metal film 21fm. The first intermediate layer 15 includes a portion provided between the first magnetic layer 11 and the second magnetic layer 12. The first intermediate layer 15 is nonmagnetic. The first intermediate layer 15 protrudes in a direction crossing the first direction (the Z-axis direction) when referenced to the second magnetic layer 12, where the first direction is from the second magnetic layer 12 toward the first magnetic layer 11.

In the manufacturing method, the surface of another portion of the metal film 21fm is processed (step S120). Thereby, the compound layer 30 that includes the metallic element included in the metal film 21fm is formed (referring to FIG. 1C). A portion of the compound layer 30 is between the metal film 21fm (the metal-containing layer 21) and the first intermediate layer 15.

According to the manufacturing method, a method for manufacturing a magnetic memory device can be provided in which the bit density can be increased.

In the magnetic memory device, as the downscaling due to increasing the bit density advances, the effects of the leakage magnetic field from the memory layer on the neighboring elements becomes large; and the write error rate WER increases. In the magnetic memory device, it is important to realize both higher recording density by element downscaling and thermal agitation resistance. According to the embodiment, the write error rate WER can be low even in the case where the element spacing is narrow. A magnetic memory device having a high thermal agitation resistance can be provided. The fluctuation of the magnetization reversal energy due to the leakage magnetic field from the proximal elements can be suppressed. The decrease of the thermal agitation resistance can be suppressed.

According to the embodiments, a magnetic memory device and a method for manufacturing the magnetic memory device can be provided in which the bit density can be increased.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch element such as a transistor, etc.) is inserted between multiple conductive bodies so that a state in which a current flows between the multiple conductive bodies is formable.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as metal containing layers, magnetic layers, intermediate layers, insulating layers, insulating portions, base layers, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices and methods for manufacturing the same practicable by an appropriate design modification by one skilled in the art based on the magnetic memory devices and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
    a metal-containing layer comprising a metallic element;
    a first magnetic layer;
    a second magnetic layer between the first magnetic layer and a portion of the metal-containing layer;
    a first intermediate layer comprising a portion provided between the first magnetic layer and the second magnetic layer, the first intermediate layer being nonmagnetic; and
    a compound layer comprising at least one selected from the group consisting of an oxide of the metallic element, a nitride of the metallic element, and an oxynitride of the metallic element,
    the first intermediate layer being convex toward the metal-containing layer, and
    at least a portion of the compound layer being between the metal-containing layer and a portion of the first intermediate layer in a direction from the second magnetic layer toward the first magnetic layer.

2. The device according to claim 1, wherein
    the second magnetic layer comprises:
        a first magnetic film; and
        a second magnetic film between the first magnetic film and the first intermediate layer.

3. The device according to claim 2, wherein the first magnetic film and the second magnetic film are antiferromagnetically coupled.

4. The device according to claim 1, wherein
    the first intermediate layer comprises an inner portion and a protruding portion,
    the inner portion is located between the first magnetic layer and the second magnetic layer,
    the protruding portion protrudes in a protruding direction crossing the direction from the second magnetic layer toward the first magnetic layer with reference to the second magnetic layer, the protruding portion is continuous with the inner portion,
    the protruding portion has a first face on a side of the metal-containing layer, the first face is directly contacts a part of the compound layer,
    the first face has a first region and a second region, a position of the first region in the protruding direction is between a position of the second region in the protruding direction and a position of the second magnetic layer,
    a first distance between the first region and the metal-containing layer along the direction from the second magnetic layer toward the first magnetic layer is shorter than a second distance between the second region and the metal-containing layer along the direction from the second magnetic layer toward the first magnetic layer,
    the inner portion has a second face in the side of the metal-containing layer, and
    a curvature of the first face is higher than a curvature of the second face.

5. A magnetic memory device, comprising:
    a metal-containing layer comprising a metallic element;
    a first magnetic layer;
    a second magnetic layer between the first magnetic layer and a portion of the metal-containing layer; and
    a first intermediate layer comprising an inner portion and an outer edge portion, at least a part of the inner portion being provided between the first magnetic layer and the second magnetic layer, the outer edge portion being around the inner portion, the first intermediate layer being nonmagnetic, the first magnetic layer having a first surface and a second surface, the first surface opposing the first intermediate layer, the second surface being on a side opposite to the first surface, in a direction from the second magnetic layer toward the first magnetic layer, a first distance between the second surface and the outer edge portion being shorter than a second distance between the second surface and the inner portion.

6. A magnetic memory device, comprising:
a metal-containing layer comprising a metallic element;
a first magnetic layer;
a second magnetic layer between the first magnetic layer and a portion of the metal-containing layer; and
a first intermediate layer comprising a portion provided between the first magnetic layer and the second magnetic layer, the first intermediate layer being nonmagnetic,
the first intermediate layer being convex toward the metal-containing layer,
wherein
the first intermediate layer is crystalline,
the first intermediate layer comprises an inner portion and an outer edge portion, the outer edge portion being around the inner portion, and
a first lattice length along one direction of the outer edge portion is different from a second lattice length along the one direction of the inner portion.

7. The device according to claim 6, wherein a ratio of an absolute value of a difference between the first lattice length and the second lattice length to the first lattice length is 1% or more.

8. The device according to claim 6, further comprising:
a first insulating portion comprising a first partial region and a second partial region; and
a second insulating portion comprising a third partial region and a fourth partial region,
the first partial region being provided between the second magnetic layer and the third partial region in a second direction crossing a first direction, the first direction being from the second magnetic layer toward the first magnetic layer,
the second partial region being provided between the second magnetic layer and the fourth partial region in a third direction, the third direction crossing the first direction and being perpendicular to the second direction,
a thickness along the second direction of the first partial region being different from a thickness along the third direction of the second partial region.

9. The device according to claim 6, further comprising a first insulating portion comprising a first partial region and a second partial region,
the first partial region overlapping the second magnetic layer in a second direction crossing a first direction, the first direction being from the second magnetic layer toward the first magnetic layer,
the second partial region overlapping the second magnetic layer in a third direction, the third direction crossing the first direction and being perpendicular to the second direction,
a material of the first partial region being different from a material of the second partial region.

10. A magnetic memory device, comprising:
a metal-containing layer comprising a metallic element;
a first magnetic layer;
a second magnetic layer between the first magnetic layer and a portion of the metal-containing layer; and
a first intermediate layer comprising an inner portion and an outer edge portion, at least a part of the inner portion being provided between the first magnetic layer and the second magnetic layer, the outer edge portion being around the inner portion, the first intermediate layer being nonmagnetic,
the first intermediate layer being crystalline,
a first lattice length along one direction of the outer edge portion being different from a second lattice length along the one direction of the inner portion.

11. The device according to claim 10, wherein the outer edge portion is continuous with the inner portion.

12. A magnetic memory device, comprising:
a metal-containing layer comprising a metallic element;
a first magnetic layer;
a second magnetic layer between the first magnetic layer and a portion of the metal-containing layer;
a first intermediate layer comprising a portion provided between the first magnetic layer and the second magnetic layer, the first intermediate layer being nonmagnetic; and
a controller,
the first intermediate layer being convex toward the metal-containing layer,
the metal-containing layer comprising a first portion and a second portion, a second direction being from the first portion toward the second portion and crossing a first direction, the first direction being from the second magnetic layer toward the first magnetic layer, the portion of the metal-containing layer being positioned between the first portion and the second portion,
the controller being electrically connected to the first portion, the second portion, and the first magnetic layer,
the controller implementing:
a first write operation of supplying a first write current to the metal-containing layer, the first write current being from the first portion toward the second portion; and
a second write operation of supplying a second write current to the metal-containing layer, the second write current being from the second portion toward the first portion,
a first electrical resistance between the first magnetic layer and the first portion after the first write operation being different from a second electrical resistance between the first magnetic layer and the first portion after the second write operation.

13. The device according to claim 12, wherein
the first magnetic layer has a first coercivity and a first thickness, the first thickness being along the first direction, and
the second magnetic layer has at least one of
a second thickness along the first direction, the second thickness being thinner than the first thickness, or
a second coercivity smaller than the first coercivity.

14. The device according to claim 12, wherein a second magnetization of the second magnetic layer is aligned with a third direction crossing the first direction and the second direction.

15. The device according to claim 12, wherein
the second magnetic layer has a first length and a second length, the first length being along a third direction, the third direction crossing the first direction and being perpendicular to the second direction, the second length being along the second direction, and the first length is longer than the second length.

16. The device according to claim 12, further comprising a third magnetic layer, a fourth magnetic layer, and a second intermediate layer, the fourth magnetic layer being provided between the third magnetic layer and another portion of the metal-containing layer, the second intermediate layer being provided between the third magnetic layer and the fourth magnetic layer, the controller being electrically connected to the first magnetic layer and the third magnetic layer, the controller setting, in the first write operation, a potential of the first magnetic layer to a potential different from a potential of the third magnetic layer.

\* \* \* \* \*